(12) United States Patent
Roham

(10) Patent No.: US 10,469,091 B2
(45) Date of Patent: Nov. 5, 2019

(54) VARIABLE DELAY

(71) Applicant: Qualcomm Incorporated, San Diego, CA (US)

(72) Inventor: Masoud Roham, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 134 days.

(21) Appl. No.: 15/711,924

(22) Filed: Sep. 21, 2017

(65) Prior Publication Data

US 2019/0089360 A1 Mar. 21, 2019

(51) Int. Cl.

| | |
|---|---|
| *H03L 7/06* | (2006.01) |
| *H03L 7/081* | (2006.01) |
| *H03L 7/18* | (2006.01) |
| *H03L 7/08* | (2006.01) |
| *H03K 5/131* | (2014.01) |
| *H03L 7/089* | (2006.01) |
| *H03L 7/189* | (2006.01) |
| *H03D 3/24* | (2006.01) |
| *H03K 5/135* | (2006.01) |
| *H03L 7/07* | (2006.01) |
| *H03L 7/099* | (2006.01) |

(52) U.S. Cl.
CPC .......... *H03L 7/0814* (2013.01); *H03D 3/241* (2013.01); *H03K 5/131* (2013.01); *H03K 5/135* (2013.01); *H03L 7/07* (2013.01); *H03L 7/0805* (2013.01); *H03L 7/0818* (2013.01); *H03L 7/0893* (2013.01); *H03L 7/0995* (2013.01); *H03L 7/1806* (2013.01); *H03L 7/189* (2013.01)

(58) Field of Classification Search
CPC ....... H03L 7/0814; H03L 7/07; H03L 7/0893; H03L 7/0805; H03L 7/0818; H03L 7/1806; H03L 7/189; H03K 5/135; H03K 5/131; H03D 3/241
USPC .......................................... 327/156
See application file for complete search history.

(56) References Cited

U.S. PATENT DOCUMENTS

| | | | |
|---|---|---|---|
| 6,259,293 B1 | 7/2001 | Hayase et al. | |
| 7,230,495 B2 | 6/2007 | Lee et al. | |
| 8,384,462 B2 | 2/2013 | Takatori | |
| 8,515,135 B2 * | 8/2013 | Clarke | ................. G06K 9/0002 310/318 |
| 9,184,499 B2 * | 11/2015 | Raczkowski | ............ H01Q 3/42 |
| 2008/0150597 A1 | 6/2008 | Hu et al. | |

(Continued)

*Primary Examiner* — Metasebia T Retebo
(74) *Attorney, Agent, or Firm* — Colby Nipper/Qualcomm

(57) ABSTRACT

This disclosure describes controlling a variable delay system with a control signal generated in a phase-locked loop (PLL). Furthermore, aspects describe generating a compensation current based on a number of edges of pulses propagating through a variable delay line including multiple delay elements. The number of edges propagating through the variable delay is determined by computing a difference between a number of edges entering the variable delay line and a number of edges exiting the variable delay line. The compensation current is derived from a mirrored version of the current of the control signal of the PLL. Thus, the techniques and systems in this disclosure provide accurate and repeatable control of a variable delay line over variations in temperature and process using low-power circuits. Furthermore, the input signal to the variable delay line may be asynchronous with respect to a system clock or a reference signal of the PLL.

30 Claims, 9 Drawing Sheets

(56) References Cited

U.S. PATENT DOCUMENTS

| | | | |
|---|---|---|---|
| 2009/0179681 A1* | 7/2009 | Nakamura | G06F 1/08 |
| | | | 327/299 |
| 2012/0019301 A1* | 1/2012 | Murray | G01R 23/15 |
| | | | 327/299 |
| 2016/0191030 A1 | 6/2016 | Kim | |
| 2018/0191356 A1* | 7/2018 | Kesarwani | H02M 3/156 |
| 2018/0375637 A1* | 12/2018 | Cesar | H04L 7/033 |

* cited by examiner

VARIABLE DELAY

FIELD OF THE DISCLOSURE

The present disclosure relates to signal usage with electronic devices and, more specifically, to implementing a variable delay to enable signals to be temporally shifted with a variable delay line.

BACKGROUND

Circuits implementing a variable delay are used throughout communications and computing devices. For example, in beamforming applications, delayed versions of signals may be combined to form a communication beam to electronically steer a signal. Beamforming can be performed with signals from an array of microphones, an antenna array, or a pixel array, such as from sensors used to detect a fingerprint. In some applications (e.g., detecting a fingerprint), the input data that is delayed to generate a beamformed signal is generated asynchronously to a system clock or reference signal. Furthermore, in some applications, such as fingerprint processing on a mobile computing device, the circuit implementing the variable delay is expected to achieve a delay that is accurate across a wide range of delay durations, as well as over variations in process and temperature.

A simple delay chain, such as one constructed with voltage-controlled delay elements, can be used to implement a variable delay. However, the delay created by the simple delay chain changes significantly over variations in process, voltage, and temperature, making it unsuitable for some applications. To mitigate the variations in delay, some approaches add a capacitor or strong buffer circuitry to a control node of the delay chain. However, the added capacitor and strong buffer circuitry occupy a large area, and the strong buffer circuitry also consumes large amounts of power. Other approaches produce a variable delay using high-frequency digital circuits. However, such high-frequency digital circuits also consume large amounts of power, and they do not provide asynchronous operation.

Accordingly, traditional circuits that implement a variable delay are not independent of variations in process and temperature while also supporting asynchronous operation with low power consumption.

SUMMARY

This summary is provided to introduce a selection of concepts in a simplified form that are further described below in the detailed description. This summary is not intended to identify key features or essential features of the claimed subject matter.

In an example aspect, a method of implementing a variable delay is described. The method includes generating a control signal that adjusts a voltage-controlled oscillator (VCO) of a phase-locked loop (PLL). The method also includes determining a number of edges of an input signal propagating through a variable delay line having a plurality of delay elements. The method additionally includes adjusting a delay of each delay element of the plurality of delay elements based on the control signal and the number of edges of the input signal propagating through the variable delay line. The method further includes delaying the input signal using the variable delay line.

In an example aspect, a system for delaying an input signal is described. The system includes a PLL, a variable delay line, an edge compensation circuit, and a circuit node. The PLL is configured to generate a control signal that adjusts a VCO of the PLL. The variable delay line includes a plurality of delay elements. The edge compensation circuit is configured to determine a number of edges of the input signal propagating through the variable delay line. The circuit node is configured to adjust a delay of each delay element of the plurality of delay elements based on the control signal and the number of edges of the input signal propagating through the variable delay line to delay the input signal.

In an example aspect, a device for adjusting a variable delay is described. The device includes a PLL, a variable delay line, and a circuit node. The PLL is configured to generate a control signal that adjusts a VCO of the PLL. The variable delay line includes a plurality of delay elements. The device also includes means for determining a number of edges of an input signal propagating through the variable delay line. The device further includes means for producing a compensation signal based on the number of edges propagating through the variable delay line. The circuit node is configured to adjust the variable delay of the variable delay line based on the control signal and the compensation signal.

In an example aspect, a circuit for adjusting a variable delay is described. The circuit includes a PLL, a voltage buffer, an edge compensation circuit, and a circuit node. The PLL is configured to generate a control signal for a VCO. The voltage buffer is configured to buffer the control signal to form a buffered control signal. The edge compensation circuit is configured to: determine a number of edges of an input signal propagating through a variable delay line and to produce a compensation signal based on the number of edges propagating through the variable delay line. The circuit node is configured to adjust the variable delay of the variable delay line based on the buffered control signal and the compensation signal.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF DRAWINGS

The detailed description references the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Figure 1:
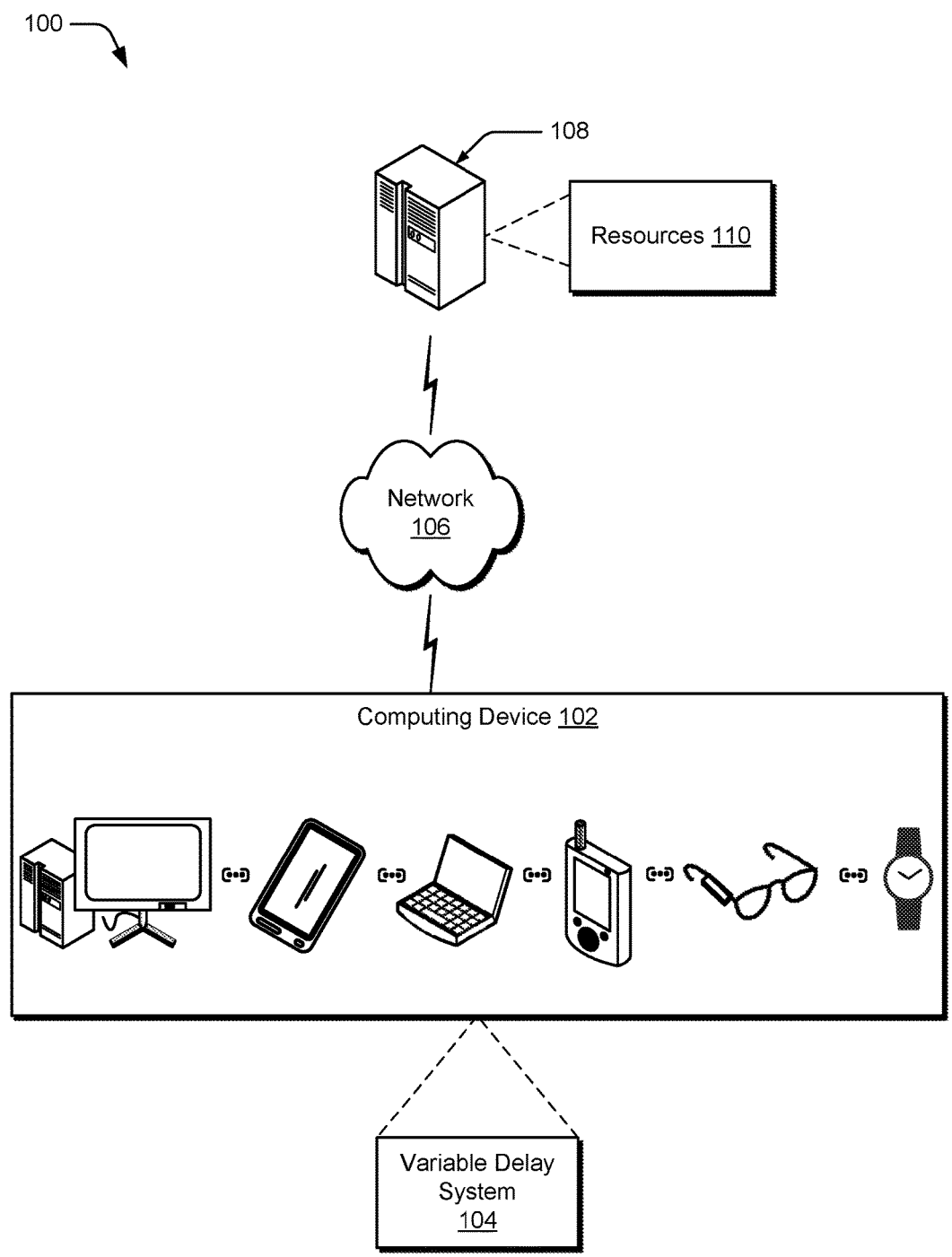
FIG. 1 illustrates an example environment in accordance with one or more aspects of the disclosure.

Variable delay circuits are used throughout communications and computing devices in a variety of applications, such as in beamforming applications where delayed versions of signals are combined to electronically steer an array. Beamforming can be performed with any suitable array, such as with a microphone array, an antenna array, or a pixel array (e.g., from sensors used to detect a fingerprint). Furthermore, in some applications, such as fingerprint processing on a mobile computing device, the circuit implementing the variable delay receives an asynchronous input signal and is expected to delay the input signal with a high level of accuracy across a wide range of delays, as well as over variations in process and temperature.

Conventional circuits implement a variable delay using high-power devices that achieve a delay that is not independent of variations in process and temperature and/or that do not support asynchronous operation. In contrast, this disclosure describes methods and circuits for implementing a variable delay with low-power devices to achieve a delay that is substantially independent of variations in process and temperature and that supports asynchronous operation. The delay is accurately and reliably adjustable or set in a manner that is substantially independent of process and temperature variations by using a control signal from a phase-locked loop (PLL) that is designed to account for variations in process and temperature while still locking onto a phase of a reference signal, as is described herein below. The control signal of the PLL adjusts a voltage-controlled oscillator (VCO) of the PLL. Delay elements of the VCO have a determinable relationship with respect to delay elements realizing the variable delay. The determinable relationship can include, for example, that the different delay elements have approximately a same delay or a determinable difference in delays (e.g., a delay designed into one or more circuits or a delay difference measured or obtained in a calibration procedure during manufacture).

The inventor has determined that pulses propagating through a variable delay line of a variable delay system cause a voltage droop at a voltage buffer output due to additional current drawn from the voltage buffer. The voltage droop induces significant variations in the achieved delay of the variable delay system. To compensate for the voltage droop, an edge compensation circuit generates a compensation current based on the number of edges of an input signal that is propagating through the variable delay line at a particular moment in time. The compensation current together with a buffered control signal output from the voltage buffer adjust a delay of the variable delay line. Thus, the edge compensation circuit alleviates the voltage buffer from generating the entirety of the additional current drawn by the variable delay line as the pulses of the input signal propagate through the variable delay line. As a result, the voltage droop at the voltage buffer output is significantly reduced, and the consistency and accuracy of the achieved delay is increased. Furthermore, because the voltage buffer can be alleviated from generating at least the majority of the additional current draw, the voltage buffer can be implemented with low power circuitry that consumes less area as compared to a high-power voltage buffer. Also, the input signal of the variable delay line is not required to be synchronous to a system clock or reference signal that runs the PLL, the edge compensation circuit, or the variable delay line of the variable delay system.

Consequently, the techniques and circuits described herein are suitable for applications requiring a variable delay that is implemented with low-power devices, that can achieve a delay that is substantially independent of variations in process and temperature, or that supports asynchronous operation, such as beamforming pixel array data for fingerprint detection in a mobile device.

In the following discussion, example systems including input PLLs, variable delay lines, voltage buffers, and edge compensation circuits are described. Techniques that elements of the example systems may implement, and a device on which elements of the example systems may be embodied, are also described. However, performance of the example procedures is not limited to the example systems, and the example systems are not limited to performance of the example procedures. Any reference made with respect to the example systems, or elements thereof, is by way of example only and is not intended to limit any of the aspects described herein.

Example Environment

FIG. 1 illustrates example environment 100 in accordance with one or more aspects of the disclosure. The example environment 100 includes a computing device 102. The computing device 102 may be configured or implemented as any suitable type of computing device. For example, the computing device 102 may be configured as a server, a server farm, a desktop computer, a laptop computer, a workstation, a mobile device, a tablet, a mobile phone, a personal digital assistant, a router, a modem, a gateway, a camera, a gaming station, a wearable device (e.g., a smart wristwatch or smart eyeglasses), and so forth. Thus, the computing device 102 may range from a high-resource device with substantial memory and processor resources (e.g., servers and personal computers) to a low-resource device with limited memory or processing resources (e.g., mobile devices). Additionally, the computing device 102 may be representative of a plurality of different devices, such as multiple devices in a server farm of a service provider, or a single computing device, such as an end-user device.

The computing device 102 is illustrated as including a variable delay system 104. The computing device 102 can also include a variety of other components, not shown in FIG. 1 for simplicity. By way of example and not limitation, the computing device 102 can include one or more processing devices, one or more computer-readable storage media, and various applications (e.g., a web browser which is operable to access various kinds of web-based resources from servers) embodied on the computer-readable storage media and operable via the processing system.

The variable delay system 104 can implement any suitable type of delay, such as a delay line/chain including one or more delay elements (e.g., voltage-controlled delay elements). In one example, the variable delay system 104 is implemented with an approximately 0.8 nanosecond (ns) delay resolution and a delay range of approximately 100 ns. Moreover, an input to the variable delay system 104 can be asynchronous to a system clock operating the variable delay system 104 or another part of the computing device 102. For instance, the input to the variable delay system 104 can include transmission pulses from a sensor array generated asynchronously to a system clock that is used as a reference signal for a phase-locked loop (PLL) that is part of the variable delay system 104.

Furthermore, the variable delay system 104 can be used in any suitable type of application. In one example, the variable delay system 104 is used to construct a beamformed signal by delaying and combining one or more signals from an array on the computing device 102. The array can be any suitable type of array, such as a microphone array, an antenna array, a pixel array, another sensor array, and the like. In one example, transmission pulses from an array are delayed to form a beamformed signal and improve a signal-to-noise ratio (SNR) (as compared to not beamforming) for fingerprint detection.

The example environment 100 also includes network 106 and one or more devices 108 that are communicatively coupled to the computing device 102 via the network 106. For instance, the one or more devices 108 can be operated by one or more service providers configured to make various resources 110 available over the network 106 to clients (e.g., the computing device 102). In some scenarios, users may sign up for accounts that are employed to access corresponding resources from a provider. The provider may authenticate credentials of a user (e.g., username and password) before granting access to an account and corresponding resources. Resources 110 may be licensed, purchased, or may be made freely available, (e.g., without authentication, license, or account-based access). Resources 110 can include any suitable combination of services and content made available over the network 106, such as, by way of example and not limitation, a video editing service, a photo editing service, a web development and management service, a collaboration service, a social networking service, a messaging service, an advertisement service, and so forth. Content may include various combinations of assets, including videos, ads, audio, multi-media streams, animations, images, web documents, web pages, applications, device applications, text documents, text messages, drawings, presentations, files (e.g., configuration files, device driver files, etc.), maps, calibration data (e.g., known relationships between circuit elements), and the like.

In one example, the one or more devices 108 comprise one or more cell phones, and the network 106 comprises a cellular network that enables a user of the computing device 102 to participate in a conversation (e.g., sharing audio, video, or audio and video) with one or more respective users of the one or more devices 108. The network 106, however, may comprise a variety of networks, including the Internet, an intranet, local area network (LAN), wide area network (WAN), personal area network (PAN), body area network (BAN), cellular networks, terrestrial networks, satellite networks, combinations of networks, and the like, and as such may be wired, wireless, or a combination thereof.

Though illustrated in FIG. 1 separately from the computing device 102, computing device 102 may comprise a portion of the network 106 or the one or more devices 108. Furthermore, the one or more devices 108 may also include one or more variable delay systems similar to the variable delay system 104. Consequently, the techniques and circuits described herein may be practiced with any suitable variable delay system, such as the variable delay system 104 comprising a part of the computing device 102, or a variable delay system comprising a part of the one or more devices 108 or a component of the network 106.

Having considered an example environment 100, consider now a discussion of an example system for controlling a variable delay.

Example System

Figure 2:
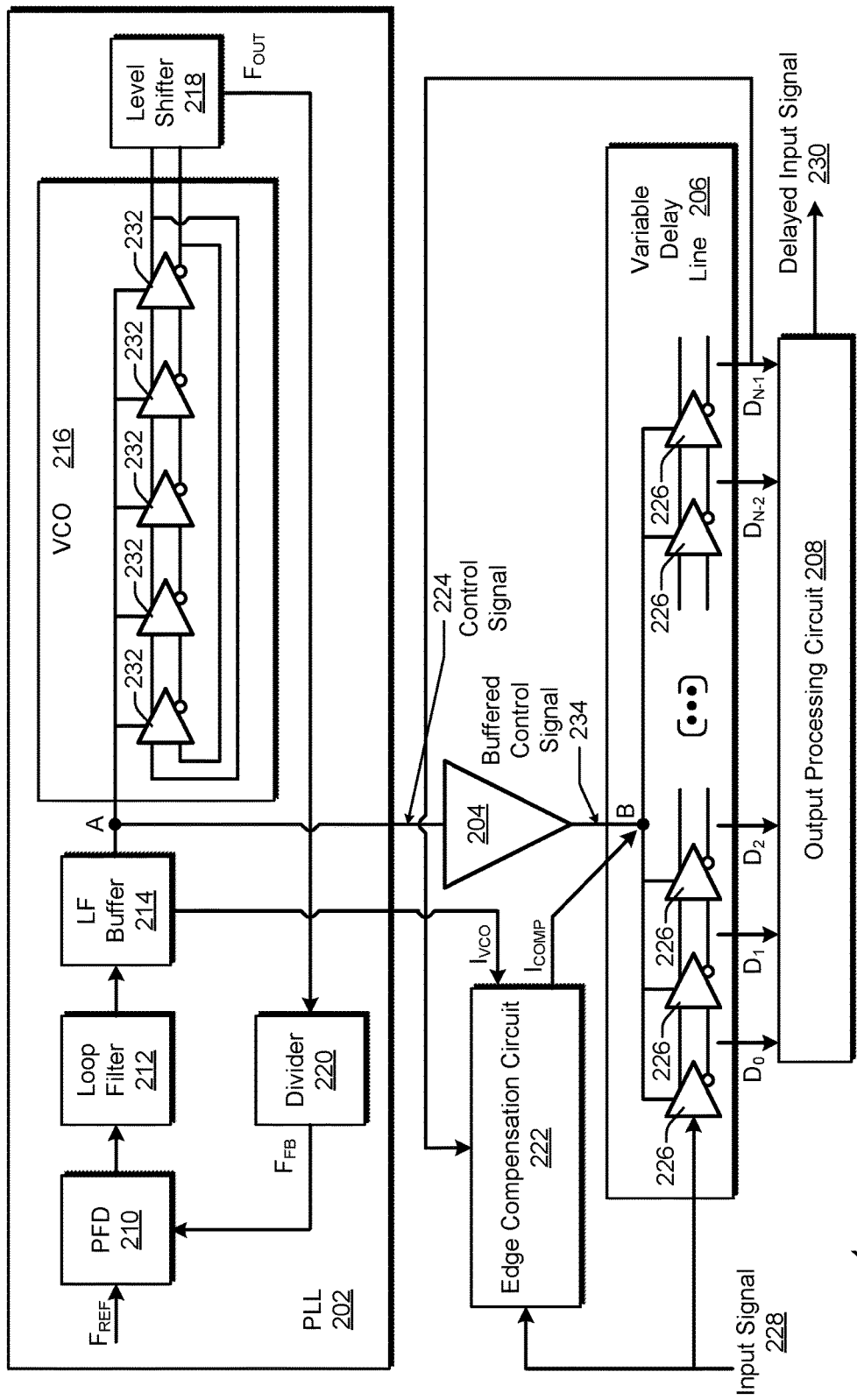
FIG. 2 illustrates an example system for controlling a variable delay in accordance with one or more aspects of the disclosure.

FIG. 2 illustrates an example variable delay system 200 for controlling a variable delay line 206 in accordance with one or more aspects of the disclosure. The variable delay system 200 is suitable for applications utilizing low-power devices to achieve a delay that is at least substantially independent of variations in process and temperature and for supporting asynchronous operation.

This section is organized as follows. A discussion of controlling a variable delay system with a PLL is followed by a discussion of the PLL (including a discussion of FIG. 3), which is followed by a discussion of an edge compensation circuit. Consider now a discussion of controlling a variable delay system with a PLL.

Controlling a Variable Delay Line with a PLL

The variable delay system 200 in FIG. 2 includes PLL 202, voltage buffer 204, and variable delay line 206. The voltage buffer 204 receives control signal 224 generated by the PLL 202 at node A. The voltage buffer 204 buffers the control signal 224 to produce buffered control signal 234 at node B. The voltage buffer 204 can delay, strengthen, or otherwise support the propagation of a version of the control signal 224 to the variable delay line 206. Thus, the voltage buffer 204 couples the buffered control signal 234, which comprises a version of the control signal 224 generated by the PLL 202 at node A, to node B of the variable delay line 206. The variable delay line 206 can be implemented using any suitable variable delay circuitry, and the line is illustrated in FIG. 2 as including N delay elements (e.g., differential inverters), some of which are specifically marked with reference number "226." In one example, N=128. The delay of each delay element 226 is adjusted according to the signal (e.g., voltage) at node B. The outputs $D_0 \ldots D_{N-1}$ of the delay elements form delayed versions of the input signal 228, with $D_M$ having a greater delay than $D_{M-1}$ for some M, M=1 ... N−1.

The variable delay line 206 provides outputs $D_0 \ldots D_{N-1}$ to output processing circuit 208. The output processing circuit 208 includes any suitable type of circuit to receive and process the outputs $D_0 \ldots D_{N-1}$ and provide at least one delayed input signal 230 as its output. In one example, the output processing circuit 208 includes an N×1 demultiplexor configured to receive the outputs $D_0 \ldots D_{N-1}$. The output processing circuit 208 is further configured to select one of the outputs as the delayed input signal 230 provided as output by the output processing circuit 208.

Furthermore, because the input signal 228 may include a digital pulse that can swing approximately to a digital rail voltage, the input signal 228 may include a larger voltage than the control signal 224 generated by the PLL 202. Consequently, the output processing circuit 208 may include level shifting circuitry configurable to adjust the level of the delayed input signal 230 (e.g., to restore the voltage swing of the delayed input signal 230 provided by the output processing circuit 208 to be approximately the same as the voltage swing of the input signal 228 provided to the variable delay line 206).

Having considered a discussion of controlling a variable delay line 206 with the PLL 202, consider now a discussion of the PLL 202.

Phase-Locked Loop (PLL)

The control voltage at node A of the PLL 202 is generated by locking the PLL 202 to a reference signal, $F_{REF}$. The PLL 202 includes phase and frequency (PFD) detector 210, loop filter 212, loop filter buffer 214, VCO 216, level shifter 218, and divider 220. For simplicity's sake, the discussion of the PLL 202 focuses on these modules. However, various embodiments can include additional components, hardware, software and/or firmware without departing from the scope of the subject matter described herein. For example, such components not shown in FIG. 1 may include, but are not limited to, control logic, direct-digital synthesizers, amplifiers, filters, oscillators, mixers, isolators, couplers, processors, and the like.

The PFD 210 compares reference signal $F_{REF}$ to a feedback signal $F_{FB}$ that is output from divider 220, and produces an error signal based on phase, frequency, or phase and frequency difference, depending on the type of detector used. The PFD 210 can be any suitable type of detector. In one example, the PFD 210 produces an error signal comprising two logical signals, e.g., UP and DN (abbreviations for up and down, respectively), representing a phase difference between reference signal $F_{REF}$ and the feedback signal $F_{FB}$ from the divider 220. Logical error signals UP and DN can be generated in the PFD 210 by determining whether the reference signal $F_{REF}$ leads or lags the feedback signal from divider 220. For instance, when reference signal $F_{REF}$ leads (lags) the feedback signal, an UP (DN) pulse is generated. Alternatively, the sense may be reversed, so when reference signal $F_{REF}$ leads (lags) the feedback signal, a DN (UP) pulse is generated. The width of the pulse comprising the error signal generated in the PFD 210 can be proportional to an amount of measured difference between the phases, frequencies, or both.

The PFD 210 also includes charge pump circuitry (not shown), which produces current responsive to the error signals. The wider the pulse of the error signal, the more current produced in the charge pump. Current from the charge pump in the PFD 210 is converted to voltage in the loop filter 212. The loop filter 212 can include any suitable type of loop filter, including single-ended, differential, active, passive, single or multiple stages, combinations thereof, and the like. In one example, the loop filter 212 includes an integrator, and the PLL 202 is a second-order loop, which is capable of acquiring and tracking phase and frequency offsets.

The loop filter buffer 214 sets a control signal 224 (e.g., a control voltage) at node A of the PLL 202 based on the output of the loop filter 212. The loop filter buffer 214 also provides a signal $I_{VCO}$ (e.g., a mirrored version or copy of the current of the control signal 224 or a mirrored version or copy of the current supplied to inverters of the VCO 216) to edge compensation circuit 222. The control signal 224 at node A set by the loop filter buffer 214 sets the control voltage of the VCO 216, thereby determining the frequency and phase of output signal $F_{OUT}$.

Figure 3:
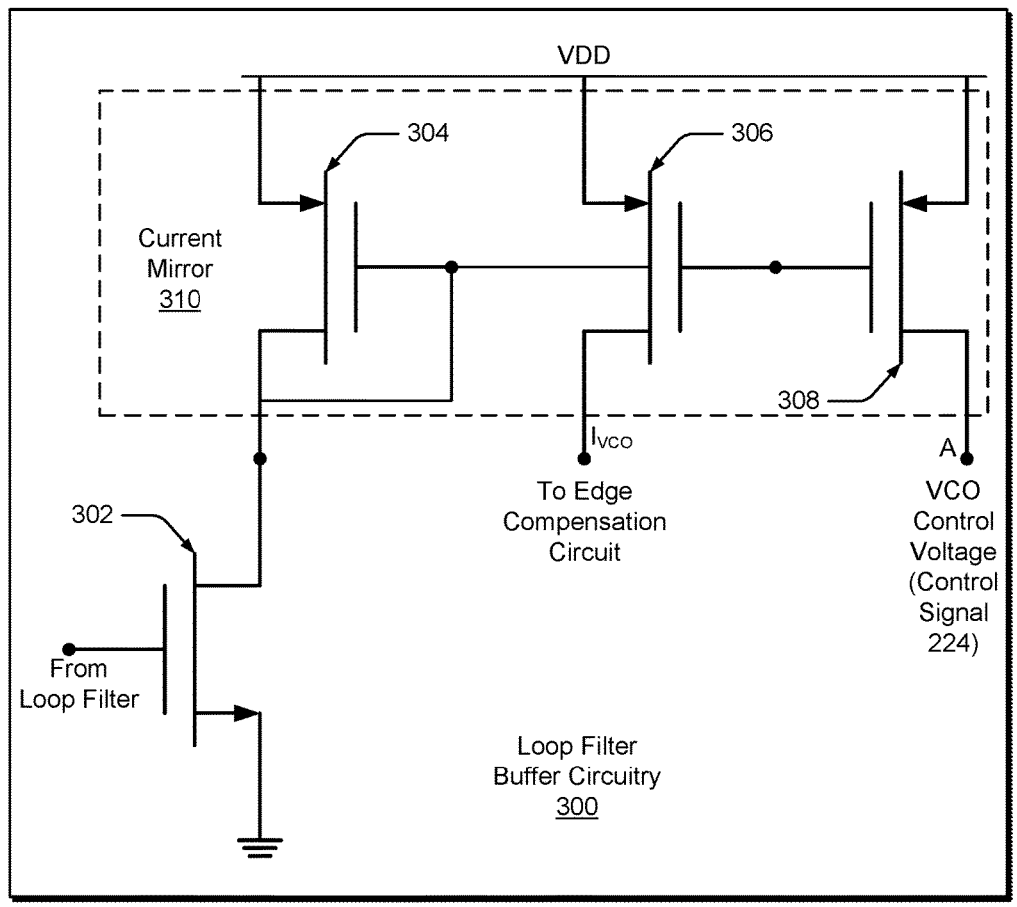
FIG. 3 illustrates example loop filter buffer circuitry in accordance with one or more aspects of the disclosure.

FIG. 3 illustrates example loop filter buffer circuitry 300 in accordance with one or more aspects of the disclosure. The loop filter buffer circuitry 300 is an example of a circuit implementing the loop filter buffer 214 in FIG. 2. The loop filter buffer circuitry 300 includes an input transistor 302, a transistor 304, a transistor 306, and a transistor 308. Source nodes of the transistors 304, 306, and 308 are each coupled to a voltage $V_{DD}$ (e.g., a supply voltage), and gate nodes of the transistors 304, 306, and 308 are coupled to each other. Further, the gate of the transistor 304 is coupled to a drain node thereof. Thus, the transistors 304, 306, and 308 form at least one current mirror 310. The transistor 306 and the transistor 308 provide output signals, including the control signal 224. The input transistor 302 receives the output of a loop filter, such as the loop filter 212 in FIG. 2. The input transistor in the example in FIG. 3 is an N-type metal-oxide-semiconductor (NMOS) device that receives the input to the loop filter buffer circuitry 300 from a loop filter on a first terminal, such as a gate of the input transistor 302. A second terminal (e.g., a source) of the input transistor 302 is connected to a ground. The ground can be any suitable type of ground.

The input signal of the loop filter buffer circuitry 300 is coupled to a third terminal (e.g., a drain) of the input transistor 302 by the input transistor 302. The drain of the input transistor 302 is connected to a third terminal (e.g., a drain) of the transistor 304. The transistor 304 is a P-type metal-oxide-semiconductor (PMOS) device that is configured as a diode by connecting its drain to a second terminal (e.g., a gate). Hence, the input transistor 302 couples the input signal to the current mirror 310 via the transistor 304. The transistor 304 has a second terminal (e.g., a source) that is connected to the voltage $V_{DD}$. The voltage $V_{DD}$ can be any suitable supply voltage, such as 1.2 or 5.0 volts.

To implement the illustrated current mirror 310, the transistor 306 and the transistor 308 each have respective first terminals (e.g., gates) that are connected. The gates of the transistor 306 and the transistor 308 are therefore connected to each other. Furthermore, a first terminal (e.g., gate) of the transistor 304 is connected to the gates of the transistor 306 and the transistor 308. Thus, the input signal of the loop filter buffer circuitry 300 is coupled to the gates of the transistor 306 and the transistor 308.

The transistor 304, the transistor 306, and the transistor 308 each also have respective second terminals (e.g., sources) connected to the voltage $V_{DD}$. A third terminal (e.g., a drain) of the transistor 308 couples the input signal to node A to provide the VCO control voltage (e.g., a control signal 224). The transistor 306 mirrors the current of the control signal 224 (e.g., the current supplied to inverters of the VCO 216 in FIG. 2). The transistor 306 can therefore supply a mirrored current, the mirrored current $I_{VCO}$, to an edge compensation circuit, such as the edge compensation circuit 222 in FIG. 2, on a third terminal (e.g., a drain) of the transistor 306.

Because the transistor 306 mirrors (e.g., copies or substantially duplicates) the current provided to the VCO, the mirrored current $I_{VCO}$ tracks variations in temperature and process by leveraging how the PLL responds to such variations. For instance, if inverters of the VCO 216 cause a change in current due to a temperature change, the mirrored current supplied to the edge compensation circuit 222 reflects that change. Thus, the variable delay system 200 in FIG. 2 operates to provide stable and accurate delays across variations in temperature and process by generating a compensation signal based on the mirrored current, $I_{VCO}$ (which is discussed below in more detail).

Further, the transistors in the loop filter buffer circuitry 300 in FIG. 3 can be implemented as any suitable type of transistors, such as a metal-oxide-semiconductor field-effect transistor MOSFET, a junction field-effect transistor (JFET), metal-semiconductor field-effect transistor (MESFET), a bipolar junction transistor (BJT), and the like; can operate in any suitable type of mode, such as depletion mode or enhancement mode; and can be n-channel or p-channel. For example, the transistor 302 may be implemented as a p-type FET, and the transistors 304, 306, and 308 may be implemented as n-type FETs. To do so, the nodal couplings of the transistors to the source voltage $V_{DD}$ and the ground potential can be swapped.

Returning to FIG. 2, the VCO 216 includes a 5-stage, 10-phase differential VCO (e.g., implemented with 5 differential delay elements comprising inverters). However, the VCO 216 can be implemented as any suitable VCO; can include any suitable number of stages; and can be single-ended, differential, or combinations thereof; and so forth. In one example, each delay element 232 of the multiple delay elements of the VCO 216 are manufactured to have an identical circuit layout as each delay element 226 of the variable delay line 206 and are intentionally designed to have a same functionality along with the same operational parameters. However, such operational parameters may vary slightly due to variations arising from the manufacturing process or due to hotspots that are generated during use. In such cases, each delay element 232 of the VCO 216 and each delay element 226 of the variable delay line 206 can have a substantially similar design to produce a substantially similar delay during operation. For instance, delay elements of the VCO 216 can have a determinable (e.g., known) relationship to delay elements of the variable delay line 206, such as having approximately the same delay or a known difference in delay (e.g., a known difference established in a calibration procedure during manufacture, during testing, or during operation).

The output of the VCO 216 is provided to the level shifter 218. The level shifter 218 can include suitable level shifting circuitry to level shift the output of the VCO 216. In one example, the level shifter 218 is configurable to adjust the level of output signal $F_{OUT}$ to swing to approximately the digital rail voltages (e.g., ±5 volts).

The divider 220 receives the output signal $F_{OUT}$ and divides it by a prescribed amount to produce the feedback signal $F_{FB}$ provided to the PFD 210. The prescribed amount of division used in the divider 220 determines the output frequency $F_{OUT}$. For example, when the divider 220 is programmed to divide by integer $N_{PLL}$, the output frequency is then given by $F_{OUT}=N_{PLL} \cdot F_{REF}$.

In one example, the PLL 202 is a fractional PLL, capable of synthesizing frequencies that are rational, non-integer multiples of the reference frequency. In such cases, the divider 220 may be programmed to divide by $N_{PLL}/M_{PLL}$ (equivalently, multiply $F_{OUT}$ by $M_{PLL}/N_{PLL}$ to form the feedback signal $F_{FB}$), so that the output frequency is then $$F_{OUT} = \frac{N_{PLL}}{M_{PLL}} \cdot F_{REF}$$

for integers $N_{PLL}$ and $M_{PLL}$. Furthermore, the divider 220 can divide $F_{OUT}$ by $N_{PLL}+\delta$ to form the feedback signal $F_{FB}$, where $N_{PLL}$ is an integer and $\delta$ represents a fractional component greater than or equal to zero, but less than one, so that the output frequency is then $F_{OUT}=(N_{PLL}+\delta) \cdot F_{REF}$, and the like. A sigma-delta modulator can be used in the divider 220 to set a fractional value that is statistically, or on average, a prescribed amount, such as by varying a divisor according to a probability.

Thus, the PLL 202 comprises a closed-loop feedback control system that locks the phase, frequency, or phase and frequency of the feedback signal $F_{FB}$ from the divider 220 to the reference signal $F_{REF}$. Since the control signal at node A of the PLL 202 is used to adjust the delay of delay elements of the variable delay line 206 (e.g., via the voltage buffer 204), the delay of the variable delay line 206 can be set by tuning the PLL 202, such as by adjusting the reference signal $F_{REF}$ (e.g., changing its frequency), or by changing a divider ratio of the divider 220. When the PLL 202 is locked, the voltage at node A is designed to maintain the delay of each delay element 232 of the VCO 216 constant to a given level of precision over wide variations in process and temperature. Furthermore, because the delay elements of the variable delay line 206 can be matched to the delay elements of the VCO 216 (e.g., manufactured from a same type of delay cell and thus have a known relationship, such as having approximately the same delay or a known difference in delay), the delay of the variable delay line 206 is likewise substantially independent of variations in process and temperature.

Having considered a discussion of the PLL 202, consider now a discussion of an edge compensation circuit.

Edge Compensation Circuit

When the input signal 228 is not propagating through the variable delay line 206, static current provided by the voltage buffer 204 to the variable delay line 206 is approximately zero. However, when edges of transmission pulses of the input signal 228 propagate through the variable delay line 206, the voltage buffer 204, absent the circuitry of the edge compensation circuit, is drawn upon to provide additional current. Consequently, the voltage at node B can droop. This voltage droop at node B degrades the accuracy of the individual delays of each individual delay element 226 of the multiple delay elements in the variable delay line 206.

To alleviate the voltage buffer 204 from generating (e.g., all of) the additional current consumed by the variable delay line 206 as pulses propagate through the variable delay line 206, the variable delay system 200 includes edge compensation circuit 222. The edge compensation circuit 222 generates a compensation current (discussed in more detail below with regard to FIG. 5) and injects the compensation current into node B. By generating the compensation current with the edge compensation circuit 222, the voltage buffer 204 is alleviated from generating the additional current, and the resulting voltage droop at node B is substantially reduced, if not effectively eliminated. Consequently, the delay achieved by the variable delay line 206 is accurately and reliably set over variations in process and temperature. Moreover, because the edge compensation circuit 222 generates the compensation current, rather than the voltage buffer 204 generating the additional current for the variable delay line 206, the voltage buffer 204 can be implemented with a low-power buffer device that is not responsible for quickly generating additional current.

Furthermore, because the VCO 216, when locked, has a pulse propagating through each delay element 232 of the delay chain of the VCO 216, the current of the control signal 224 (e.g., the current used by the inverters of the VCO 216) that is mirrored in the loop filter buffer 214 and provided to the edge compensation circuit 222 is a stable reference current.

Moreover, the compensation current is generated by the edge compensation circuit 222 based on the mirrored current provided by the loop filter buffer 214 (as is described below in more detail with regards to FIG. 5). Thus, the compensation current generated by the edge compensation circuit 222 tracks variations in process and temperature. For instance, if the current that is provided to the inverters of the VCO 216 changes due to a temperature change, the compensation current also changes based on the temperature change. This occurs because the compensation current is generated based on the mirrored current, $I_{VCO}$. Consequently, current is provided to the delay elements of the variable delay line 206 also based on the change in temperature. Thus, the variable delay system 200 operates to provide stable and accurate delays in the variable delay line 206 across process and temperature variations.

In addition, the variable delay system 200 does not require that the input signal 228 be synchronous to a system clock that is operating the variable delay system 200. For instance, the input signal 228 and the reference signal $F_{REF}$ can be asynchronous.

Having considered a discussion of the example variable delay system 200, consider now a discussion of example signal waveforms.

Example Signal Waveforms

Figure 4:
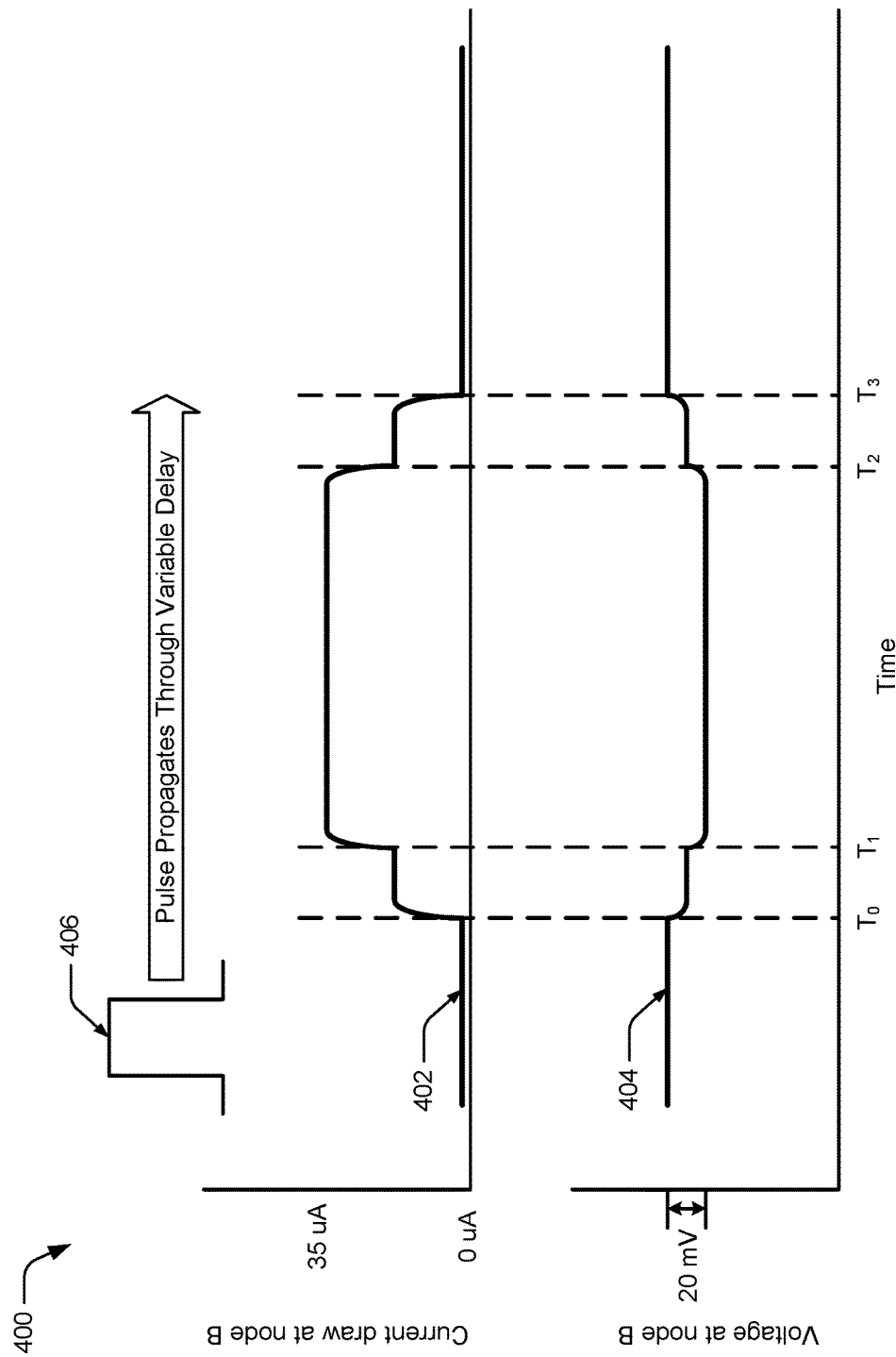
FIG. 4 illustrates example signal waveforms that represent different circuit parameters in accordance with one or more aspects of the disclosure.

FIG. 4 illustrates example signal waveforms 400 that represent different circuit parameters in accordance with one or more aspects of the disclosure. The inventor has determined that the amount of current to be provided to the variable delay line 206 at node B in FIG. 2 for compensation purposes can be proportional to the number of edges of the input signal 228 propagating through the variable delay line 206. This determination is illustrated in the example signal waveforms 400 depicted in FIG. 4. The example signal waveforms 400 include current trace 402 and voltage trace 404, both of which are plotted versus time. The current trace 402 represents current draw at node B of FIG. 2 (e.g., that is consumed by the variable delay line 206). The voltage trace 404 represents the voltage at node B of FIG. 2. For the example signal waveforms 400, the edge compensation circuit 222 is disabled (e.g., the compensation current $I_{COMP}$ injected into node B has a zero magnitude and the voltage buffer 204 is responsible for providing the additional current to the variable delay line 206 to handle the propagating pulses).

A pulse 406 having a rising edge and a falling edge propagates through a variable delay system (e.g., the variable delay line 206 in FIG. 2). At various times $T_i$, an edge of the pulse enters or leaves the variable delay line 206. At time $T_0$, the rising edge of the pulse 406 enters the variable delay line 206. At time $T_1$, the falling edge of the pulse 406 enters the variable delay line 206. At time $T_2$, the rising edge of the pulse 406 leaves the variable delay line 206. At time $T_3$, the falling edge of the pulse 406 leaves the variable delay line 206.

In this example, prior to the pulse propagating through the variable delay line 206, the variable delay line 206 is empty of signal pulses. Consequently, the current trace 402, for time less than $T_0$, is approximately 0 μA. Furthermore, the voltage trace 404 is at a given operating voltage, such as that set according to the buffered control signal 234 at node B.

When the rising edge of the pulse 406 enters the variable delay line 206 at time $T_0$, however, the variable delay line 206 consumes additional current, which causes the current trace 402 to increase (e.g., to approximately 35/2 μA). Consequently, the voltage trace 404 droops (e.g., by about 20/2 mV).

When the falling edge of the pulse 406 enters the variable delay line 206 at time $T_1$, the variable delay line 206 consumes still more current, which causes the current trace 402 to again increase (e.g., to approximately 35 μA). Consequently, the voltage trace 404 droops further (e.g., another 20/2 mV to about 20 mV from the original operating point).

While the pulse 406 is propagating through the variable delay line 206 between $T_1$ and $T_2$, the current trace 402 remains at approximately 35 μA, and the voltage trace 404 maintains the voltage droop of approximately 20 mV. The current draw of the current trace 402 and the voltage droop of the voltage trace 404 return to approximately 35/2 μA and 20/2 mV, respectively, as the rising edge of the pulse 406 leaves the variable delay line 206 at $T_2$. At $T_3$, when the falling edge of the pulse 406 leaves the variable delay line 206, the current trace 402 and the voltage trace 404 return to their static operating values, such as when no pulses are propagating through the variable delay line.

The voltage droop at node B induced by one or more pulses propagating through the variable delay line 206 can result in significant changes to the delay achieved by each delay element 226 because the voltage provided to the delay element 226 drops. For example, for a single pulse in the variable delay line 206, the error that is caused by the voltage droop can be approximately 11% of the delay as compared to when no voltage droop is present (e.g., no edges are propagating in the variable delay line 206). When multiple pulses of the input signal 228 are simultaneously propagating through the variable delay line 206, the voltage droop, and the resulting error in the achieved delay, is exacerbated.

The voltage droop at node B can be compensated by generating a compensation current proportional to the number of edges of the input signal 228 that are propagating along the variable delay line 206, and by injecting the compensation current into node B. By generating the compensation current with the edge compensation circuit 222 of FIG. 2, the voltage buffer 204 can be alleviated from generating at least a substantial portion of the additional current used by the variable delay line 206 to propagate pulses of the input signal 228. Consequently, the voltage droop at node B indicated in the voltage trace 404 in FIG. 4 is reduced when the compensation current from the edge compensation circuit 222 is enabled (e.g., injected into node B).

Having considered a discussion of example signal waveforms 400, consider now a discussion of an example edge compensation circuit.

Example Edge Compensation Circuit

Figure 5:
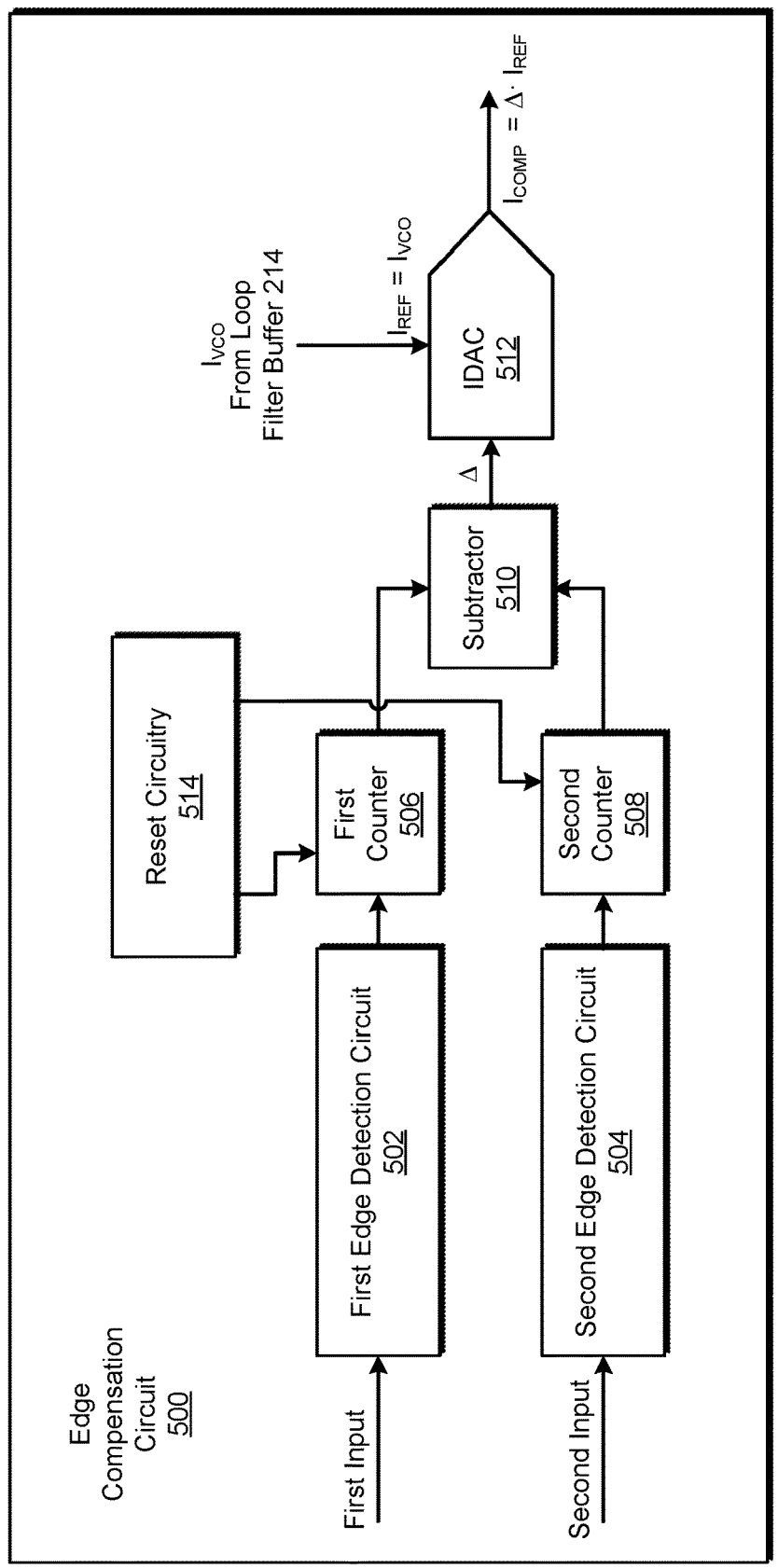
FIG. 5 illustrates an example edge compensation circuit in accordance with one or more aspects of the disclosure.

FIG. 5 illustrates an example edge compensation circuit 500 in accordance with one or more aspects of the disclosure. The example edge compensation circuit 500 is an example of the edge compensation circuit 222 in FIG. 2. The edge compensation circuit 500 includes a first input and a second input. In one example, the first input is also the input signal 228 to the variable delay line 206, and the second signal is an output signal from the variable delay line 206, such as from a last delay element 226 (having an output $D_{N-1}$) of a plurality of delay elements of the variable delay line 206.

The edge compensation circuit 500 includes a first edge detection circuit 502 and a second edge detection circuit 504. The first edge detection circuit 502 receives the first input, and the second edge detection circuit 504 receives the second input. In one example implementation, the first edge detection circuit 502 and the second edge detection circuit 504 have or are constructed using circuits that are designed to be at least similar (e.g., identical, comparable, or analogous) so as to operate in a similar fashion. The first edge detection circuit 502 and the second edge detection circuit 504 can include any suitable type of circuitry to detect an edge of the signal input to the circuitry, such as a rising edge and/or a falling edge of a pulse, and to output an indicator that an edge has been detected. For instance, the circuitry can include slope detection circuitry configured to detect an edge based on a measured slope of the input signal being greater than a prescribed slope amount.

The edge detection circuits 502 and 504 may output an indicator for a rising edge, an indicator for a falling edge, an indicator for a rising edge and a falling edge (e.g., one indicator for a pulse), or some combination thereof. Furthermore, an indicator for one type of edge (e.g., a rising edge) may be the same as or different from an indicator for another type of edge (e.g., a falling edge).

The edge compensation circuit 500 also includes a first counter 506 and a second counter 508. The first edge detection circuit 502 and the second edge detection circuit 504 output respective indicators, such as if an edge is detected, and provide the respective indicators to the first counter 506 and the second counter 508, respectively. Providing the indicators to the first counter 506 and the second counter 508 can be done in any suitable way, such as by setting a voltage to indicate a high or low value, setting a field or programmable register value, sending respective pulses to the counters, and the like.

Thus, the first counter 506 and the second counter 508 receive respective indicators from the first edge detection circuit 502 and the second edge detection circuit 504. The first counter 506 and the second counter 508 each contain counters that increment responsive to receiving an indicator, such as an indicator that an edge has been detected. The counter values from each of the first counter 506 and the second counter 508 are provided to a subtractor 510.

As shown, the edge compensation circuit 500 further includes reset circuitry 514. The reset circuitry 514 is coupled to, and is configured to reset, the first counter 506 and the second counter 508. The reset circuitry 514 can reset the first and second counters 506 and 508 using a single reset signal or two separate reset signals. In one example, counters in the first counter 506 and the second counter 508 are reset synchronously. For instance, if a counter in the first counter 506 or the second counter 508 resets, such as responsive to receiving a reset signal or overflowing an accumulator, the counter in the other of the first counter 506 or the second counter 508 can also be reset. Alternatively, the first counter 506 and the second counter 508 can be reset asynchronously.

Further, the first counter 506 and the second counter 508 may each include multiple counters. For example, one counter may count rising edges, and another counter may count falling edges, as distinguished from different types of indicators provided from the edge detection circuits 502 and 504. The counter values provided to the subtractor 510 can therefore represent counts of rising edges, counts of falling edges, counts of rising edges and falling edges, or counts of pulses, which can include a rising edge/falling edge pair. In one example, the indicators provided from the edge detection circuits 502 and 504 are a same type of indicator for rising and falling edges, and the counter values provided to the subtractor 510 represent numbers of edges, including both rising edges and falling edges, that are propagating through the variable delay line 206.

In operation, the subtractor 510 is configured to determine a difference between one of the counter values and the other of the counter values received from the first counter 506 and the second counter 508, respectively. In one example, the subtractor 510 subtracts the counter value received from the second counter 508 from the counter value received from the first counter 506. Alternatively, the subtractor 510 can subtract the counter value received from the first counter 506 from the counter value received from the second counter 508. Furthermore, the subtractor 510 can include circuitry configured to take a magnitude of the result of the subtraction, so that the output of the subtractor 510, which is indicated as a difference or delta ($\Delta$) in FIG. 5, is a non-negative value. The subtractor 510 provides the output difference ($\Delta$) to a current digital-to-analog converter (IDAC) 512.

In one example, the first input and the second input of the edge compensation circuit 500 are received from the input signal 228 and the output (e.g., the delayed input signal 230) of a delay chain of a variable delay system 200 (e.g., the variable delay line 206 in FIG. 2). Hence, the edge compensation circuit 500 can count the number of edges entering the input of the variable delay line 206 at the first counter 506 and the number of edges exiting the output of the variable delay line 206 at the second counter 508. The difference $\Delta$ between the counter values calculated by the subtractor 510 therefore corresponds to the number of edges of the input signal 228 propagating through the variable delay line 206 at a given moment. This difference is transformed to an analog current with the IDAC 512.

The IDAC 512 receives the output difference $\Delta$ from the subtractor 510 and the current signal $I_{VCO}$ from the loop filter buffer 214, such as the current of the control signal 224 for the VCO 216 provided by the transistor 306 of the current mirror 310 in FIG. 3, as discussed previously. The IDAC 512 uses the current signal $I_{VCO}$ as a reference current $I_{REF}$ (e.g., $I_{REF}=I_{VCO}$) to generate an output current. Thus, the output current of the IDAC 512 forms the compensation current $I_{COMP}$ that is injected into node B in FIG. 2. In an example implementation, the compensation current $I_{COMP}$ is based on the reference current $I_{REF}$ and the input to the IDAC 512, which is the count difference (e.g., $I_{COMP}=\Delta \cdot I_{REF}$).

Because the reference current $I_{REF}$ is derived from the current $I_{VCO}$ of the control signal 224 that adjusts the VCO 216, the compensation current $I_{COMP}$ tracks variations in process and temperature. By generating the compensation current with the edge compensation circuit 500, the voltage buffer 204 in FIG. 2 is alleviated from generating at least a portion of the current utilized by the variable delay line 206 to propagate pulses. This effectively prevents an induced voltage droop at the output of the voltage buffer 204, which corresponds to the buffered voltage signal 234. For example, the edge compensation circuit 222 can generate at least a substantial portion of the additional current consumed by the variable delay line 206 to propagate pulses of the input signal 228 along each delay element 226 the multiple delay elements. Consequently, the voltage buffer 204 can be implemented with a low-power voltage buffer, rather than a strong voltage buffer that consumes large amounts of power to quickly produce increased current. Furthermore, the edge compensation circuit 500 in FIG. 5 includes relatively simple circuitry, such as edge detection circuits, counters, adders, and the IDAC 512, and therefore does not consume large amounts of power. Moreover, the reference current $I_{REF}$ used to generate the compensation current $I_{COMP}$ comprises a mirrored version of the current $I_{VCO}$ of the control signal 224. Mirroring the current $I_{VCO}$ can be accomplished with low-power circuitry (e.g., the transistor 306 in the loop filter buffer circuitry 300 in FIG. 3), as compared to generating additional (e.g., new) current. Consequently, the systems and techniques described herein can be implemented to provide stable and accurate control of a variable delay system over variations in process and temperature with little additional power consumption.

In one example, for a single pulse (one rising edge and one falling edge) in the variable delay line and with the edge compensation circuit 500 disabled, the error that is caused by the voltage droop at node B of FIG. 2 is approximately 11% of the delay when no voltage droop is present (e.g., no edges are in the variable delay). By enabling the edge compensation circuit 500 to inject compensation current into node B and thus alleviate the voltage buffer 204 from providing at least a substantial portion of the additional current consumed by the variable delay line, the error in the achieved delay for the single pulse propagating along the variable delay line is reduced from approximately 11% without compensation to approximately 0.2% using the compensation current, with negligible extra power consumption. Thus, the improvement is substantial.

Having considered a discussion of edge compensation circuit 500, consider now a discussion of example delay circuitry.

Example Delay Circuit

Figure 6:
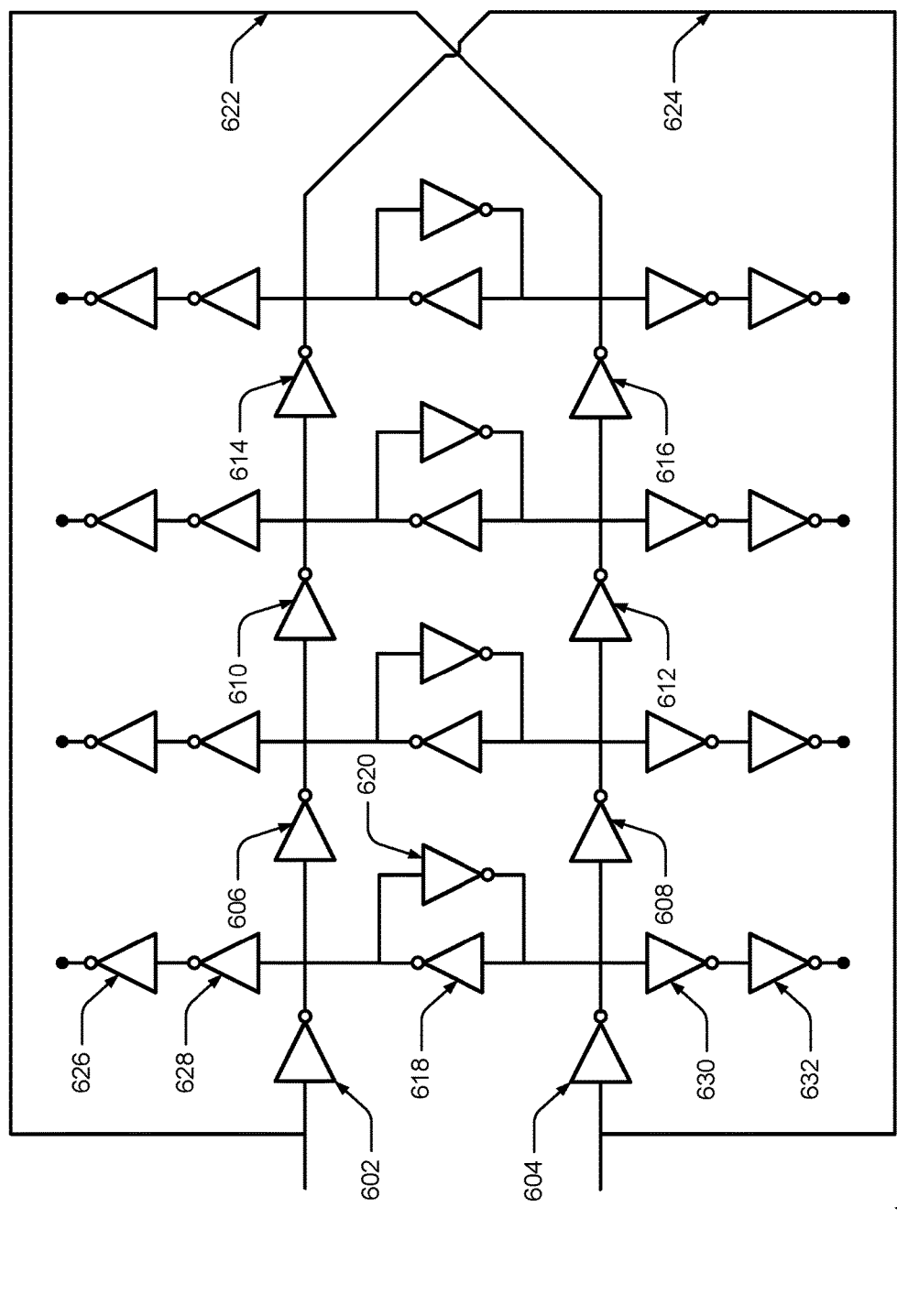
FIG. 6 illustrates example delay circuitry in accordance with one or more aspects of the disclosure.

FIG. 6 illustrates example delay circuitry 600 in accordance with one or more aspects of the disclosure. The delay circuitry 600 is an example of circuitry that can implement the VCO 216 and/or the variable delay line 206 in FIG. 2. The delay circuitry 600 is illustrated as a differential circuit, where components of a differential input are respectively supplied to a first pair of inverters including inverters 602 and 604. However, circuitry implementing the VCO 216 and/or the variable delay line 206 in FIG. 2 can include any suitable type of circuitry, such as differential, single-ended, combinations thereof, and the like. Furthermore, the example delay circuitry 600 in FIG. 6 is illustrated with four delay stages. In general, however, circuitry implementing the VCO 216 and/or the variable delay line 206 in FIG. 2 can include any suitable number of delay stages. Because the example delay circuitry 600 is differential, the number of delay stages can be an even number or an odd number.

The delay circuitry 600 includes a pair of inverters for each delay element/stage of the delay circuitry 600. For example, a second pair of inverters including inverters 606 and 608 is respectively coupled to the outputs of the first pair of inverters (e.g., inverters 602 and 604). Furthermore, a third pair of inverters including inverters 610 and 612 are respectively coupled to the outputs of the second pair of inverters, and a fourth pair of inverters including inverters 614 and 616 are respectively coupled to the outputs of the third pair of inverters. These different pairs of inverters can respectively comprise a delay element 226 or 232 of the variable delay line 206 or the VCO 216, respectively. The pairs of inverters can delay an input signal (e.g., applied to the first pair of inverters) as the input signal propagates through the delay circuitry 600.

Between the stages of the delay circuitry (e.g., between the pairs of inverters described above) is a nested pair of inverters coupling differential sides of the delay circuitry 600. For example, a nested pair of inverters including inverters 618 and 620 is connected between the first pair of inverters (e.g., an output of the inverters 602 and 604) and the second pair of inverters (e.g., an input of the inverters 606 and 608). The inverters 618 and 620 are nested because an output of the inverter 618 is connected to an input to the inverter 620, and an output of the inverter 620 is connected to an input of the inverter 618.

When the delay circuitry 600 is implemented as a VCO, the outputs of the last pair of inverters in the delay chain (e.g., inverters 614 and 616) are fed back to the inputs of the first pair of inverters (e.g., inverters 602 and 604), as indicated by feedback signals 622 and 624. Because the outputs of the pairs of inverters oscillate between high and low voltage values, and the delays of the inverters depend on the voltage applied to the inverters, the frequency of oscillation can be controlled by adjusting the voltage level supplied to the inverters in the delay circuitry 600. For instance, the control signal 224 generated by the PLL 202 in FIG. 2 can be used to control the inverters in the delay circuitry 600 in FIG. 6. In one example, by increasing (decreasing) the voltage applied to the inverters, the delays of the inverters decrease (increase), causing the frequency of oscillation to increase (decrease).

When the delay circuitry 600 is implemented as a variable delay line (e.g., chained inverters included as part of the variable delay line 206 in FIG. 2) rather than a VCO, the feedback signals 622 and 624 are omitted, or suitably disconnected, such as with a switch or switches (not shown). In this case, the delay of the inverters (e.g., inverters 602 and 604, and the like) can be adjusted according to the voltage supplied to the inverters, such as with the control signal 224 generated by the PLL 202 and the buffered control signal 234 at node B in FIG. 2. By varying the control voltage 224, the delay can be finely adjusted. In one example, by increasing (decreasing) the voltage applied to the inverters, the delay of the inverters decreases (increases). To cover larger ranges of delays, multiple delay stages (e.g., more than the four stages illustrated in FIG. 6) can be used, such as 128 or 256 delay stages. In one example, the delay circuitry 600 is implemented with approximately 0.8 nsec delay resolution and a delay range of approximately 100 nsec.

The outputs of different delay stages are provided via output buffers. For example, inverters 626 and 628 form an output buffer connected to the output of inverter 602. Inverters 626 and 628 are serially connected to each other. The output of inverter 626 can be accessed, such as with a demultiplexor, to provide a delayed version of the input signal applied to the delay circuitry 600. For instance, the output of inverter 626 corresponds to one component of a differential output with a single stage of delay from inverter 602 (e.g., $D_0$ in FIG. 2). The complementary component of the differential output can be accessed via the output buffer including serial inverters 630 and 632 connected to the output of the inverter 604. Each of the delay stages of the delay circuitry 600 has similarly-connected output buffers, so that delayed versions of the input signal can be selected corresponding to various delays spanning the delay chain. In one example, when the delay circuitry 600 is implemented as a VCO, the output buffers (e.g., inverters 626, 628, 630, and 632) are omitted.

The circuits and systems described herein constitute an improvement over circuits implementing a variable delay system with high-power devices that achieve a delay that is not independent of variations in process and temperature and/or that do not support asynchronous operation. Instead, this disclosure describes circuits and systems for implementing a variable delay system with low-power devices to achieve a delay that is substantially independent of variations in process and temperature and that supports asynchronous operation. The delay can be accurately and reliably adjusted across process and temperature variations with a control signal from a phase-locked loop (PLL), via a voltage buffer, and a compensation current based on a number of edges of an input signal propagating through a variable delay line of the variable delay system.

Having considered discussions of example circuits, consider now example procedures in accordance with one or more aspects.

Example Procedures

Figure 7:
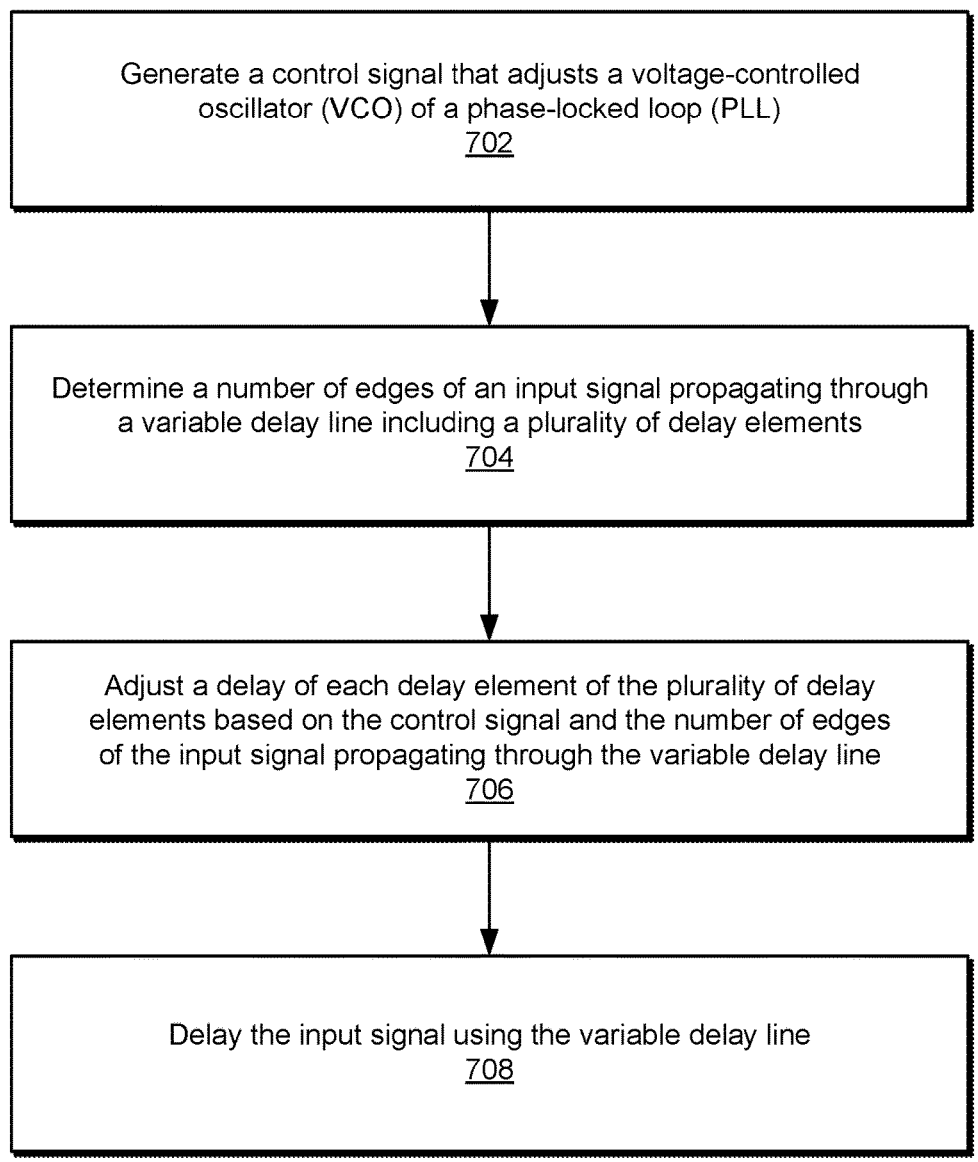
FIG. 7 is a flow diagram depicting an example procedure in accordance with one or more aspects of the disclosure.

FIG. 7 illustrates an example procedure 700 for delaying an input signal with a variable delay in accordance with one or more aspects of the disclosure. Aspects of the procedure may be implemented in hardware, such as by using the example circuits depicted in the drawings and described herein. The procedure is shown as a set of blocks that specify operations performed by one or more devices and are not necessarily limited to the orders shown for performing the operations by the respective blocks. In at least some aspects, the procedure may be performed by a suitably configured device or devices, such as the computing device 102 in FIG. 1, or any device including the variable delay system 200 in FIG. 2.

A PLL generates a control signal that adjusts a voltage-controlled oscillator (VCO) of the PLL (block 702). For example, the PLL 202 can generate the control signal 224 that adjusts the VCO 216. In one implementation, the input signal 228 and the reference signal $F_{REF}$ of the PLL 202 are asynchronous. For instance, the input signal 228 can include pulses generated from at least one sensor used to detect a fingerprint, and the pulses can be generated asynchronously to the reference signal $F_{REF}$ used for the PLL 202.

A number of edges of an input signal that are propagating through a variable delay line including a plurality of delay elements is determined (block 704). For example, an edge compensation circuit 222 or 500 can determine a number of edges of the input signal 228 propagating through the variable delay line 206, which includes a plurality of delay elements, each of which is indicated by reference number 226 in FIG. 2. In one implementation, determining the number of edges includes counting a number of edges of the input signal 228 to produce a first count, counting a number of edges at a last delay element 226 of the plurality of delay elements to produce a second count, and computing a difference between the second count and the first count.

In an example system, the VCO 216 includes an additional plurality of delay elements, each of which is indicated by reference number 232. Each delay element 232 of the additional plurality of delay elements of the VCO 216 has approximately a same delay as the delay of each delay element 226 of the plurality of delay elements of the variable delay line 206. In some implementations, the plurality of delay elements of the variable delay line 206 can adjust a beamformed version of the input signal 228. Furthermore, the PLL 202 and the plurality of delay elements of the variable delay line 206 can be embodied on a System-on-a-Chip (SoC).

A delay of each delay element of the plurality of delay elements is adjusted based on the control signal and the number of edges of the input signal propagating through the variable delay line (block 708). For example, a delay of each delay element 226 of the plurality of delay elements of the variable delay line 206 can be adjusted based on the control signal 224 and the number of edges of the input signal 228 propagating through the variable delay line 206. A circuit node, such as node B, that is coupled to the control signal 224 may adjust a delay of each delay element 226 of the plurality of delay elements based on the control signal 224, such as a version thereof—like the buffered control signal 234, and based on the number of edges of the input signal 228 propagating through the variable delay line 206. To do so, the edge compensation circuit 222 or 500 can be configured to generate a compensation current $I_{COMP}$ proportional to the number of propagating edges, and the delay can be set based on the number of propagating edges by injecting the compensation current $I_{COMP}$ into the circuit node B coupled to the buffered control signal 234.

The compensation current $I_{COMP}$ compensates for an additional current drawn by the variable delay line 206 caused by delaying the input signal 228 using the plurality of delay elements. Otherwise, without the injected compensation current $I_{COMP}$, the additional current drawn by the variable delay line 206 can lower a voltage of the buffered control signal 234 provided by the voltage buffer 204 at node B. In one example, the compensation current $I_{COMP}$ is generated by mirroring a current of the control signal 224 to form a mirrored current $I_{VCO}$, providing the mirrored current $I_{VCO}$ to a digital-to-analog converter (DAC) (e.g., IDAC 512) as a reference current $I_{REF}$, and converting the number of propagating edges with the DAC based on the reference current $I_{REF}$ to produce the compensation current $I_{COMP}$.

The input signal is delayed using the variable delay line (block 708). For example, the variable delay line 206 can delay the input signal 228 using at least one delay element 226 of the plurality of delay elements. An output D of one of the delay elements 226 of the plurality of delay elements can be selected as a delayed input signal 230 (e.g., a delayed version of the input signal 228), such as with a demultiplexor, and then level-shifted with level-shifting circuitry. In one implementation, the VCO 216 includes an additional plurality of delay elements, and each delay element 232 of the additional plurality of delay elements is manufactured with similar circuitry as used for each delay element 226 of the plurality of delay elements.

Furthermore, at least one of the mirrored current $I_{VCO}$, the reference current $I_{REF}$, the compensation current $I_{COMP}$, the control signal 224, the voltage buffer 204, or the buffered control signal 234 can be adjusted based on calibration data indicative of a determinable relationship between the VCO 216 and the plurality of delay elements of the variable delay line 206. In one example, a determinable relationship includes a difference in the delay of each delay element 226 of the plurality of delay elements of the variable delay line 206 and another delay of each delay element 232 of an additional plurality of delay elements of the VCO 216. The calibration data can be obtained from a calibration process performed at any suitable time, such as during device manufacture by a vendor, during device assembly (e.g., when populating a printed circuit board), by a customer of the vendor who is not an end user, or by an end user when a device is installed or end-user-license agreement is executed. In one example, a computing device, such as computing device 102 in FIG. 1, obtains the calibration data from a server over a network.

In one example, each delay element 226 of the plurality of delay elements of the variable delay line 206 includes at least one inverter, such as a differential inverter. Moreover, the delay of each delay element 226 of the plurality of delay elements can be changed by changing the reference signal $F_{REF}$ or a value of the divider 220 of the PLL 202 to change the control signal 224 generated by the PLL 202.

Figure 8:
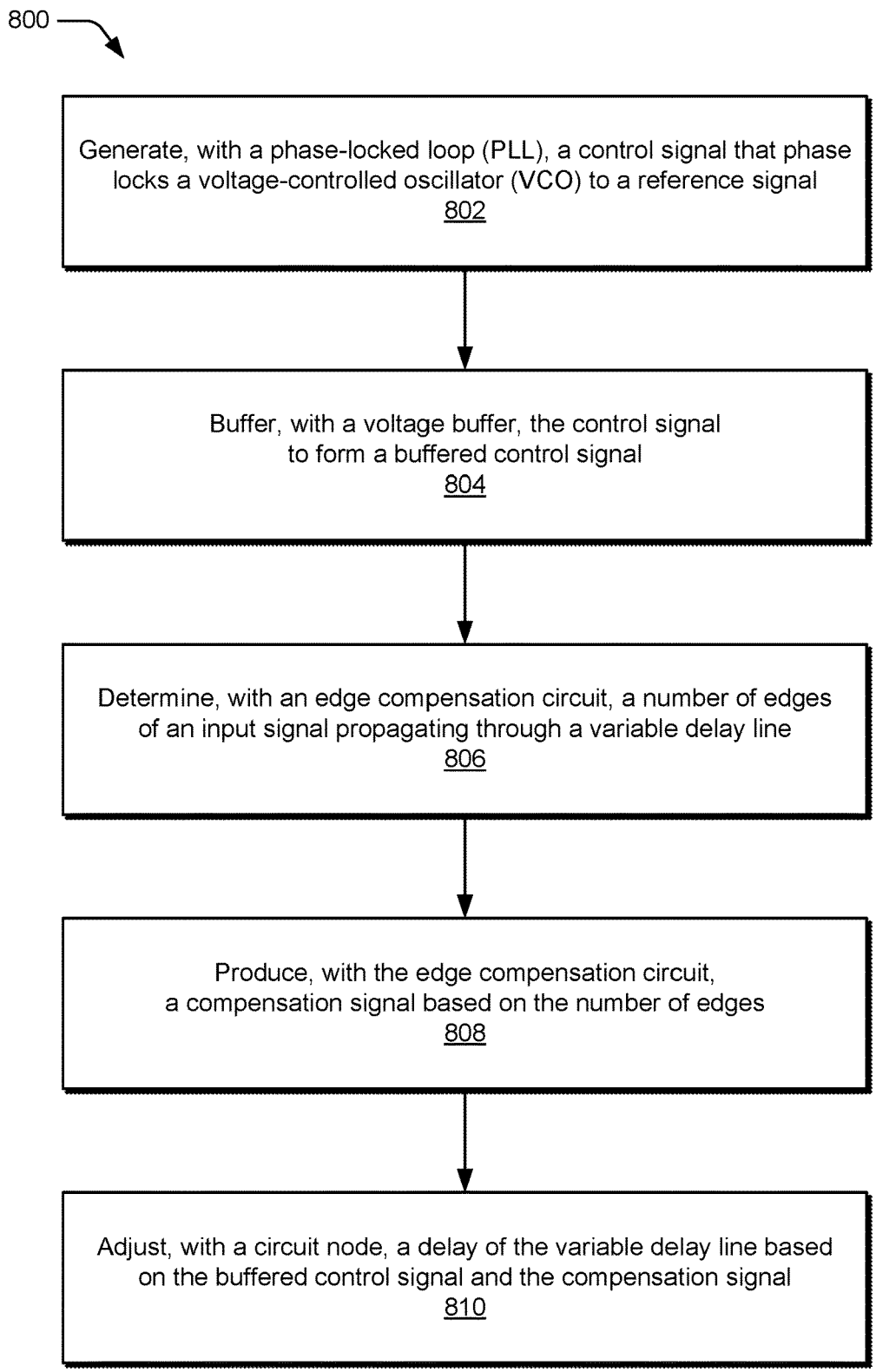
FIG. 8 is a flow diagram depicting another example procedure in accordance with one or more aspects of the disclosure.

FIG. 8 illustrates an example procedure 800 for controlling a variable delay in accordance with one or more aspects of the disclosure. Aspects of the procedure may be implemented in hardware, such as by using the example circuits depicted in the drawings and described herein. The procedure is shown as a set of blocks that specify operations performed by one or more devices and are not necessarily limited to the orders shown for performing the operations by the respective blocks. In at least some aspects, the procedure may be performed by a suitably configured device or devices, such as computing device 102 in FIG. 1, or any device including variable delay system 200 in FIG. 2.

A PLL generates a control signal that phase locks a voltage-controlled oscillator (VCO) to a reference signal (block 802). For example, the PLL 202 can generate the control signal 224 that phase locks the VCO 216 to the reference signal $F_{REF}$. The control signal 224 controls the frequency of the VCO 216. In one implementation, the control signal 224 sets a voltage on inverters of the VCO 216 to set the frequency of oscillation of the VCO 216.

A voltage buffer buffers the control signal to form a buffered control signal (block 804). For example, the voltage buffer 204 can be coupled to a loop filter buffer circuit 214 or 300 to obtain the control signal 224, and the voltage buffer 204 outputs the buffered control signal 234 based on the obtained control signal 224. In one implementation, the voltage buffer 204 is realized as a low-power device that is configured to provide current below a threshold amount of current, and not provide current in an amount above the threshold amount.

An edge compensation circuit determines a number of edges of an input signal propagating through the variable delay line (block 806). For example, the edge compensation circuit 222 or 500 can determine a number of edges of the input signal 228 propagating through the variable delay line 206. In one implementation, the edge compensation circuit 222 or 500 includes a first counter 506 for counting a number of edges of the input signal 228 entering the variable delay line 206 to produce a first count and a second counter 508 for counting a number of edges exiting the variable delay line 206 at an output (e.g., D or the delayed input signal 230) of the variable delay line 206 to produce a second count. The edge compensation circuit 222 or 500 also includes a subtractor 510 for determining a difference between the first count and the second count, such as by subtracting the second count from the first count, or vice versa, to determine the number of edges propagating through the variable delay line 206 at a given moment.

The edge compensation circuit produces a compensation signal based on the number of edges (block 808). For example, the edge compensation circuit 222 or 500 can produce a compensation signal based on the number of edges propagating through the variable delay line 206. The compensation signal (e.g., a compensation current $I_{COMP}$) can be produced so that the compensation signal is proportional to the number of edges propagating through the variable delay line 206. In one implementation, the device implementing procedure 800 can also include a loop filter buffer circuit 214 or 300 configured to mirror a current of the control signal 224 to produce a mirrored current $I_{VCO}$. The compensation signal can be produced by, for instance, multiplying the mirrored current $I_{VCO}$ with the number of edges propagating through the variable delay line 206.

Furthermore, the loop filter buffer circuit 214 or 300 can include a current mirror 310 to mirror the current of the control signal 224 to produce the mirrored current $I_{VCO}$. The edge compensation circuit 222 or 500 can include a digital-to-analog converter (DAC) configured to receive the mirrored current $I_{VCO}$ as a reference current $I_{REF}$ and produce the compensation signal by multiplying the reference current $I_{REF}$ with the number of edges propagating through the variable delay line 206. Thus, the compensation signal can include a compensation current $I_{COMP}$ that alleviates the voltage buffer 204 from having to provide any, or at least all, of the additional current drawn by the variable delay line 206 when propagating the pulses of the input signal 228 through the variable delay line 206.

A circuit node adjusts a variable delay of the variable delay line based on the buffered control signal and the compensation signal (block 810). For example, the circuit node B can adjust a variable delay of the variable delay line 206 based on the buffered control signal 234 and the compensation signal from the edge compensation circuit 222 or 500. For instance, the variable delay line 206 can include a plurality of delay elements, and the circuit node B may adjust a voltage on the plurality of delay elements to adjust a delay of each delay element 226. The compensation signal supplies current to the plurality of delay elements by injecting compensation current $I_{COMP}$ into the circuit node B, thus alleviating the voltage buffer 204 from providing all the additional current consumed while the variable delay line 206 propagates pulses.

Accordingly, the methods described herein constitute an improvement over methods implementing a variable delay with high-power devices that achieve a delay that is not independent of variations in process and temperature and/or that do not support asynchronous operation. Instead, this disclosure describes methods for implementing a variable delay with low-power devices to achieve a delay that is substantially independent of variations in process and temperature and that supports asynchronous operation. The variable delay can be accurately and reliably adjusted across process and temperature variations with a control signal from a phase-locked loop (PLL), via a voltage buffer, and a compensation current based on the number of edges of an input signal propagating through a variable delay line.

Having considered a discussion of example methods for controlling a variable delay of a variable delay system and delaying an input signal with a variable delay line thereof, consider now a discussion of a device on which aspects of controlling the variable delay of the variable delay system and delaying an input signal with the variable delay line thereof can be implemented.

Example Device

Figure 9:
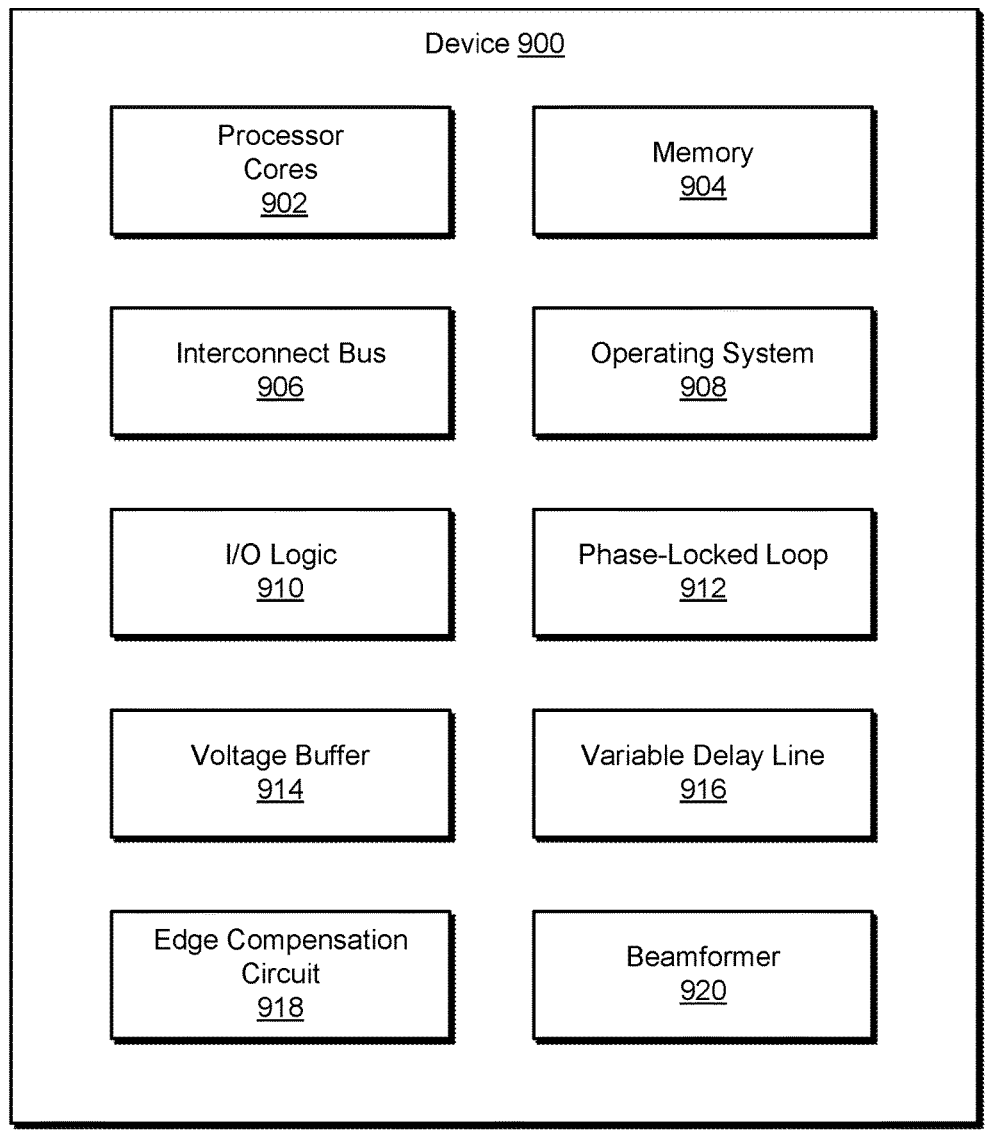
FIG. 9 illustrates an example device that can be employed for one or more implementations described herein.

FIG. 9 illustrates an example device 900, which includes components capable of implementing aspects of controlling the delay of a variable delay system and delaying an input signal with a variable delay line. The device 900 may be implemented as, or in, any suitable electronic device, such as a modem, broadband router, access point, cellular phone, smart-phone, tablet, gaming device, laptop computer, desk top computer, net book, set-top-box, smart-phone, network-attached storage (NAS) device, cell tower, satellite, cable head-end, work station, testing station, server, test and measurement equipment, combinations thereof, and/or any other device that may control the delay of a variable delay and delay an input signal with the variable delay. The device 900 can comprise one or more devices, and is illustrated as a single device in FIG. 9 for simplicity. For instance, the device 900 may be implemented on multiple devices connected over a network.

The device 900 may be integrated with a microprocessor, storage media, I/O logic, data interfaces, logic gates, a transmitter, a receiver, circuitry, firmware, software, and/or combinations thereof to provide communicative or processing functionalities. The device 900 may include a data bus (e.g., cross bar or interconnect fabric) enabling communication between the various components of the device. In some aspects, components of the device 900 may interact via the data bus to implement aspects of controlling the delay of a variable delay and delaying an input signal with the variable delay.

In this particular example, the device 900 includes processor cores 902 and memory 904. The memory 904 may include any suitable type of memory, such as volatile memory (e.g., DRAM), non-volatile memory (e.g., flash), cache, and the like. In the context of this disclosure, the memory 904 is implemented as a storage medium, and does not include transitory propagating signals or carrier waves. An interconnect bus 906 allows components of the device 900 to interact, such as to access the memory 904. The memory 904 can store data and processor-executable instructions of the device 900, such as operating system 908 and other applications. The processor cores 902 may execute the operating system 908 and other applications from the memory 904 to implement functions of the device 900, the data of which may be stored to the memory 904 for future access. The device 900 may also include I/O logic 910, which can be configured to provide a variety of I/O ports or data interfaces for communication.

The device 900 also includes PLL 912. The PLL 202 in FIG. 2, is an example of the PLL 912. The PLL 912 may include any suitable type of circuitry to phase lock a VCO to a reference signal by generating a control signal. The control signal is buffered by voltage buffer 914 of the device 900. The voltage buffer 204 in FIG. 2 is an example of the voltage buffer 914. The voltage buffer 914 can be a low-power buffer that does not produce large amounts of current.

The device 900 also includes variable delay line 916. The variable delay line 206 in FIG. 2 is an example of the variable delay line 916. The variable delay line 916 includes delay elements, such as inverters, whose delay is controlled by a voltage, such as the control signal generated by the PLL 912.

The device 900 also includes edge compensation circuit 918. The edge compensation circuit 222 in FIG. 1 and the edge compensation circuit 500 in FIG. 5 are examples of the edge compensation circuit 918. The edge compensation circuit 918 detects a number of edges of an input signal propagating through the variable delay line 916 at a given time, and produces a compensation current based on the detected number of edges. The compensation current is used together with the voltage buffered by the voltage buffer 914 to set the delay of delay elements of the variable delay line 916. In one example, the edge compensation circuit 918 injects compensation current into a circuit node where the voltage buffer 914 is connected to the variable delay line 916 (e.g., node B in FIG. 2). Thus, the edge compensation circuit 918 can alleviate the voltage buffer 914 from generating a significant portion of additional current consumed by the variable delay line 916 to propagate an oscillating signal.

The device 900 also includes a beamformer 920 that delays signals using the variable delay and combines the delayed signals to electronically steer a beamformed signal. The beamformer 920 can steer a beamformed signal of any suitable type of signals, such as acoustic transmission pulses from a fingerprint sensor, electrical or mechanical signals from an array of microphones, electrical signals from an array on antennas, and the like.

In one or more exemplary aspects, the functions described may be implemented in hardware, such as digital or analog circuitry, hard-coded logic, or any combination thereof. Generally, functions may be stored on a computer-readable storage medium (CRM). In the context of this disclosure, a computer-readable storage medium may be any available medium that can be accessed by a general-purpose or special-purpose computer that does not include transitory propagating signals or carrier waves. By way of example, and not limitation, such media can comprise RAM, ROM, EEPROM, CD-ROM or other optical disk storage, magnetic disk storage, or other magnetic storage devices, or any other non-transitory medium that can be used to carry or store information that can be accessed by a general-purpose or special-purpose computer, or a general-purpose or special-purpose processor. The information can include any suitable type of data, such as computer-readable instructions, sampled signal values, data structures, program components, or other data. These examples, and any combination of storage media and/or memory devices, are intended to fit within the scope of non-transitory computer-readable media. Disk and disc, as used herein, includes compact disc (CD), laser disc, optical disc, digital versatile disc (DVD), and Blu-ray disc where disks usually reproduce data magnetically, while discs reproduce data optically with a laser. Combinations of the above should also be included within the scope of computer-readable media.

Firmware components include electronic components with programmable memory configured to store executable instructions that direct the electronic component how to operate. In some cases, the executable instructions stored on the electronic component are permanent, while in other cases, the executable instructions can be updated and/or altered. At times, firmware components can be used in combination with hardware components and/or software components.

The terms "component" and "system" are intended to refer to one or more computer-related entities, such as hardware, firmware, software, circuitry, or any combination thereof, as further described above. At times, a component may refer to a process and/or thread of execution that is defined by processor-executable instructions. Alternately or additionally, a component may refer to various electronic and/or hardware entities, as well as active or passive circuit devices.

Certain specific aspects are described above for instructional purposes. The teachings of this disclosure have general applicability, however, and are not limited to the specific aspects described above.

What is claimed is:

1. A method of implementing a variable delay, the method comprising:
   generating a control signal that adjusts a voltage-controlled oscillator (VCO) of a phase-locked loop (PLL) responsive to operation of the PLL;
   determining a number of edges of an input signal propagating through a variable delay line comprising a plurality of delay elements, the determining comprising:
      counting a number of edges of the input signal entering the variable delay line to produce a first count;
      counting a number of edges exiting the variable delay line to produce a second count; and
      determining a difference between the second count and the first count using a subtraction operation to determine the number of edges of the input signal propagating through the variable delay line;
   adjusting a delay of each delay element of the plurality of delay elements based on the control signal and the number of edges of the input signal propagating through the variable delay line; and
   delaying the input signal using the variable delay line.

2. The method as recited in claim 1, further comprising:
   generating a compensation current proportional to the number of edges of the input signal propagating through the variable delay line, wherein
   the adjusting the delay based on the number of edges of the input signal propagating through the variable delay line comprises adjusting the delay of each delay element of the plurality of delay elements using the compensation current.

3. The method as recited in claim 2, further comprising:
   buffering the control signal to form a buffered control signal, wherein
   the adjusting the delay of each delay element of the plurality of delay elements using the compensation current comprises injecting the compensation current into a circuit node coupled to the buffered control signal; and
   the compensation current compensates for current consumed by the variable delay line by propagating the edges of the input signal to resist a voltage change in the buffered control signal.

4. The method as recited in claim 2, wherein the generating the compensation current comprises:
mirroring a current of the control signal to form a mirrored current;
providing the mirrored current to a digital-to-analog converter (DAC) as a reference current; and
converting the number of edges of the input signal propagating through the variable delay line with the DAC based on the reference current to produce the compensation current.

5. The method as recited in claim 4, further comprising:
adjusting at least one of the mirrored current, the reference current, the compensation current, or the control signal based on calibration data indicative of a determinable relationship between the VCO and the plurality of delay elements.

6. The method as recited in claim 5, wherein the determinable relationship includes a difference in the delay of each delay element of the plurality of delay elements and another delay of each delay element of an additional plurality of delay elements comprising the VCO.

7. The method as recited in claim 1, wherein:
the VCO includes an additional plurality of delay elements; and
each delay element of the additional plurality of delay elements of the VCO and each delay element of the plurality of delay elements of the variable delay line have a substantially similar design to produce a substantially similar delay during operation.

8. The method as recited in claim 1, wherein the input signal is asynchronous with respect to a reference signal of the PLL.

9. The method as recited in claim 1, wherein the input signal comprises pulses generated for at least one sensor configured to detect a fingerprint.

10. The method as recited in claim 1, further comprising:
adjusting a beamformed signal using one or more outputs of the plurality of delay elements of the variable delay line.

11. The method as recited in claim 1, wherein the PLL and the plurality of delay elements of the variable delay line are embodied on a System-on-a-Chip (SoC).

12. The method as recited in claim 1, wherein a voltage swing of the input signal is larger than a voltage swing of the control signal.

13. The method as recited in claim 1, further comprising:
selecting an output of one delay element of the plurality of delay elements as a delayed input signal; and
level-shifting the delayed input signal.

14. The method as recited in claim 1, wherein each delay element of the plurality of delay elements comprises at least one inverter.

15. The method as recited in claim 1, wherein the adjusting comprises:
adjusting the delay of each delay element of the plurality of delay elements by changing at least one of:
a reference signal of the PLL to adjust the control signal; or
a divider ratio of the PLL to adjust the control signal.

16. A system for delaying an input signal, the system comprising:
a phase-locked loop (PLL) configured to generate a control signal that adjusts a voltage-controlled oscillator (VCO) of the PLL;
a variable delay line comprising a plurality of delay elements;
an edge compensation circuit configured to determine a number of edges of the input signal propagating through the variable delay line, the edge compensation circuit comprising:
a first counter configured to count a number of edges of the input signal entering the variable delay line to produce a first count;
a second counter configured to count a number of edges exiting the variable delay line to produce a second count; and
a subtractor configured to determine a difference between the second count and the first count to determine the number of edges of the input signal propagating through the variable delay line; and
a node configured to adjust a delay of each delay element of the plurality of delay elements based on the control signal and the number of edges of the input signal propagating through the variable delay line to delay the input signal.

17. The system as recited in claim 16, wherein the system comprises at least one of a System-on-a-Chip (SoC) or a computing device.

18. The system as recited in claim 16, wherein the edge compensation circuit is further configured to:
generate a compensation current proportional to the number of edges of the input signal propagating through the variable delay line; and
inject the compensation current into the node to adjust the delay of each delay element based on the number of edges of the input signal propagating through the variable delay line.

19. The system as recited in claim 18, wherein:
the edge compensation circuit comprises a digital-to-analog converter (DAC); and
the edge compensation circuit is further configured to:
obtain a mirrored version of a current of the control signal from the PLL;
provide the mirrored version of the current to the DAC as a reference current; and
convert the number of edges of the input signal propagating through the variable delay line with the DAC based on the reference current to produce the compensation current.

20. The system as recited in claim 16, wherein:
the VCO includes an additional plurality of delay elements; and
each delay element of the additional plurality of delay elements of the VCO and each delay element of the plurality of delay elements of the variable delay line have a substantially similar design to produce a substantially similar delay during operation.

21. A device for adjusting a variable delay, the device comprising:
a phase-locked loop (PLL) configured to generate a control signal that adjusts a voltage-controlled oscillator (VCO) of the PLL;
a variable delay line comprising a plurality of delay elements;
means for determining a number of edges of an input signal propagating through the variable delay line, the means for determining comprising:
means for counting a number of edges of the input signal entering the variable delay line to produce a first count;

means for counting a number of edges exiting the variable delay line to produce a second count; and
means for determining a difference between the second count and the first count to determine the number of edges of the input signal propagating through the variable delay line;
means for producing a compensation signal based on the number of edges of the input signal propagating through the variable delay line; and
a node configured to adjust the variable delay of the variable delay line based on the control signal and the compensation signal.

22. The device as recited in claim 21, wherein the means for producing the compensation signal includes means for producing the compensation signal proportional to the number of edges of the input signal propagating through the variable delay line.

23. The device as recited in claim 21, further comprising:
means for mirroring a current of the control signal to produce a mirrored current, wherein
the means for producing the compensation signal includes means for multiplying the mirrored current with the number of edges of the input signal propagating through the variable delay line.

24. The device as recited in claim 21, further comprising:
means for buffering the control signal to form a buffered control signal, wherein
the node is configured to adjust the variable delay of the variable delay line based on the buffered control signal and the compensation signal; and
the compensation signal comprises a compensation current that is configured to at least partially alleviate the means for buffering the control signal from providing current to the variable delay line to account for current consumed by propagating the edges of the input signal through the variable delay line.

25. A circuit for adjusting a variable delay, the circuit comprising:
a phase-locked loop (PLL) configured to generate a control signal for a voltage-controlled oscillator (VCO);
a voltage buffer configured to buffer the control signal to form a buffered control signal;
an edge compensation circuit configured to determine a number of edges of an input signal propagating through a variable delay line, the edge compensation circuit comprising:
a first counter configured to count a number of edges of the input signal entering the variable delay line to produce a first count;
a second counter configured to count a number of edges exiting the variable delay line to produce a second count; and
a subtractor configured to determine a difference between the second count and the first count to determine the number of edges of the input signal propagating through the variable delay line, wherein
the edge compensation circuit is configured to produce a compensation signal based on the number of edges of the input signal propagating through the variable delay line; and
a node configured to adjust the variable delay of the variable delay line based on the buffered control signal and the compensation signal.

26. The circuit as recited in claim 25, further comprising:
a current mirror circuit configured to mirror a current of the control signal to produce a mirrored current, wherein
the edge compensation circuit includes a digital-to-analog converter (DAC) configured to receive the mirrored current as a reference current and to produce the compensation signal by multiplying the reference current with the number of edges of the input signal propagating through the variable delay line.

27. The circuit as recited in claim 25, further comprising:
the variable delay line including a plurality of delay elements, wherein
the node corresponds to an output of the voltage buffer and is configured to adjust a voltage for the plurality of delay elements to adjust a delay of each delay element.

28. The system as recited in claim 17, further comprising:
at least one sensor operably coupled to the variable delay line and configured to detect a fingerprint.

29. The system as recited in claim 18, further comprising:
a voltage buffer configured to buffer the control signal to form a buffered control signal that is coupled to the node, wherein
the edge compensation circuit is further configured to generate the compensation current to compensate for current consumed by the variable delay line by propagating the edges of the input signal to resist a voltage change in the buffered control signal.

30. The system as recited in claim 16, wherein the edge compensation circuit further comprises:
reset circuitry coupled to the first counter and the second counter and configured to reset at least one of the first counter or the second counter.

* * * * *